US012615809B2

(12) United States Patent
Kim et al.

(10) Patent No.: US 12,615,809 B2
(45) Date of Patent: Apr. 28, 2026

(54) SEMICONDUCTOR DEVICE AND METHOD FOR FABRICATING THE SAME

(71) Applicant: SK hynix Inc., Gyeonggi-do (KR)

(72) Inventors: Il Do Kim, Gyeonggi-do (KR); Ji Hee Yu, Gyeonggi-do (KR); Seung Bum Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 358 days.

(21) Appl. No.: 18/362,976

(22) Filed: Aug. 1, 2023

(65) Prior Publication Data

US 2024/0290826 A1     Aug. 29, 2024

(30) Foreign Application Priority Data

Feb. 28, 2023     (KR) ........................ 10-2023-0026710

(51) Int. Cl.
| | |
|---|---|
| *H01L 29/06* | (2006.01) |
| *H10B 12/00* | (2023.01) |
| *H10D 62/10* | (2025.01) |
| *H10D 64/27* | (2025.01) |
| *H10D 64/66* | (2025.01) |

(52) U.S. Cl.
CPC ......... *H10D 62/102* (2025.01); *H10B 12/312* (2023.02); *H10B 12/482* (2023.02); *H10B 12/485* (2023.02); *H10B 12/488* (2023.02); *H10D 64/512* (2025.01); *H10D 64/518* (2025.01); *H10D 64/519* (2025.01); *H10D 64/661* (2025.01); *H10D 64/665* (2025.01); *H10D 64/667* (2025.01)

(58) Field of Classification Search
CPC .. H10D 62/102; H10D 64/512; H10D 64/518; H10D 64/519; H10D 64/661; H10D 64/665; H10D 64/667; H10B 12/312; H10B 12/482; H10B 12/485; H10B 12/488; H10B 12/30; H10B 12/02; H10B 12/03; H10B 12/05
See application file for complete search history.

(56) References Cited

U.S. PATENT DOCUMENTS

| | | | | |
|---|---|---|---|---|
| 2010/0327337 | A1* | 12/2010 | Yang ..................... | H10B 12/053 |
| | | | | 257/334 |
| 2021/0183862 | A1 | 6/2021 | Son et al. | |
| 2022/0013524 | A1* | 1/2022 | Ryu ........................ | H10D 86/80 |
| 2022/0399341 | A1* | 12/2022 | Kim ..................... | H10B 12/485 |

* cited by examiner

*Primary Examiner* — Mohammed R Alam
(74) *Attorney, Agent, or Firm* — IP&T GROUP LLP

(57) ABSTRACT

A semiconductor device may include: a lower structure; a horizontal layer spaced apart from the lower structure and extending along a direction parallel to the lower structure; a vertical conductive line extending along a direction perpendicular to the lower structure and coupled to a first side end of the horizontal layer; a data storage element coupled to a second side end of the horizontal layer; and a horizontal conductive line extending along a direction crossing the horizontal layer and including a sloped side facing the vertical conductive line.

20 Claims, 14 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2023-0026710, filed on Feb. 28, 2023, which is incorporated herein by reference in its entirety.

BACKGROUND

1. Technical Field

Various embodiments of the present disclosure relate to a semiconductor device, and more particularly, to a semiconductor device including a three-dimensional (3D) memory cell and a method for fabricating the same.

2. Related Art

Recently, in order to cope with a large capacity and miniaturization of a memory device, a technique for providing a 3D memory device in which a plurality of memory cells are stacked has been advanced.

SUMMARY

Various embodiments of the present disclosure are directed to a semiconductor device having highly integrated memory cells and a method for fabricating the same.

In accordance with one embodiment, a semiconductor device may include: a lower structure; a horizontal layer spaced apart from the lower structure and extending along a direction parallel to the lower structure; a vertical conductive line extending along a direction perpendicular to the lower structure and coupled to a first side end of the horizontal layer; a data storage element coupled to a second side end of the horizontal layer; and a horizontal conductive line extending along a direction crossing the horizontal layer and including a sloped side facing the vertical conductive line. The horizontal conductive line may include: a first work function electrode; a second work function electrode having the sloped side facing the vertical conductive line and having a lower work function than the first work function electrode; and a third work function electrode adjacent to the data storage element and having a lower work function than the first work function electrode.

In accordance with another embodiment, a method for fabricating a semiconductor device may include: forming a stack body in which an insulating layer, a first sacrificial layer, a semiconductor layer and a second sacrificial layer are alternately stacked over a lower structure; forming a vertical opening by etching the stack body; forming horizontal recesses by recessing the first and second sacrificial layers from the vertical opening; forming a horizontal conductive line including a combination of different work function electrodes, in the horizontal recesses; and forming a vertical conductive line in the vertical opening, wherein the forming of the horizontal conductive line may include: forming a first low work function electrode; forming a high work function electrode on a side surface of the first low work function electrode; and forming a second low work function electrode including a sloped side facing the vertical conductive line, on a side surface of the high work function electrode. The method further may include: forming a first barrier layer between the high work function electrode and the first low work function electrode; and forming a second barrier layer between the high work function electrode and the second low work function electrode. The first barrier layer includes a protrusion a) covering the high work function electrode and b) disposed on an inner side surface of the first low work function electrode. The first and second low work function electrodes each include N-type dopant doped polysilicon. The high work function electrode includes a metal-based material. The method further comprising forming a data storage element coupled to the other side end of the horizontal layer, after the forming of the horizontal conductive line.

In accordance with still another embodiment, a semiconductor device may include: a semiconductor layer spaced apart from a lower structure and extending along a direction parallel to the lower structure; a vertical conductive line extending along a direction perpendicular to a substrate and coupled to one side end of the semiconductor layer; a data storage element coupled to the other side end of the semiconductor layer; and a word line extending along a direction crossing the semiconductor layer, wherein the word line may include: a metal electrode; a first polysilicon electrode having a sloped side adjacent to the vertical conductive line and having a lower work function than the metal electrode; and a second polysilicon electrode adjacent to the data storage element and having a lower work function than the metal electrode.

In accordance with yet another embodiment, a semiconductor device may include: a lower structure; a 3D array including a column array of transistors vertically stacked over the lower structure; a vertical conductive line vertically oriented over the lower structure and coupled to one side of each of the transistors of the 3D array in common; and a data storage element coupled to the other side of each of the transistors of the 3D array, wherein the transistors of the column array of the 3D array may each include: a horizontal layer; and a horizontal conductive line having a triple work function electrode structure horizontally extending along a direction crossing the horizontal layer. The horizontal conductive line having the triple work function electrode structure may include a first low work function electrode adjacent to the data storage element, a second low work function electrode adjacent to the vertical conductive line, and a high work function electrode between the first low work function electrode and the second low work function electrode. The second low work function electrode of the horizontal conductive line may include a sloped side adjacent to the vertical conductive line. In accordance with yet another embodiment, a semiconductor device may include: a lower structure; a horizontal layer spaced apart from the lower structure and extending along a direction parallel to the lower structure; a vertical bit line extending along a direction perpendicular to the lower structure and coupled to a first side end of the horizontal layer; a capacitor coupled to a second side end of the horizontal layer; and a horizontal word line extending along a direction crossing the horizontal layer, wherein the horizontal word line comprising: a first work function electrode; a second work function electrode having a sloped side facing the vertical bit line and having a lower work function than the first work function electrode; and a third work function electrode adjacent to the capacitor and having a lower work function than the first work function electrode.

In accordance with yet another embodiment, a semiconductor device may include a lower structure; a horizontal layer spaced apart from the lower structure and extending along a direction parallel to the lower structure; a vertical bit line extending along a direction perpendicular to the lower structure and coupled to a first side end of the horizontal layer; a capacitor coupled to a second side end of the horizontal layer; and a horizontal word line extending along a direction crossing the horizontal layer, wherein the horizontal word line comprising: a first work function electrode; a second work function electrode having a sloped side facing the vertical bit line and having a lower work function than the first work function electrode; and a third work function electrode adjacent to the capacitor and having a lower work function than the first work function electrode. The horizontal layer comprises a source region coupled to the vertical bit line; a drain region coupled to the data storage element; and a channel disposed between the source region and the drain region. The first work function electrode, having the higher work function, overlaps the channel, the second work function electrode overlaps the source region, and the third work function electrode overlaps the drain region. The second work function electrode is disposed between the first work function electrode and the vertical bit line, and the third work function electrode is disposed between the first work function electrode and the data storage element.

DETAILED DESCRIPTION

Figure 1A:
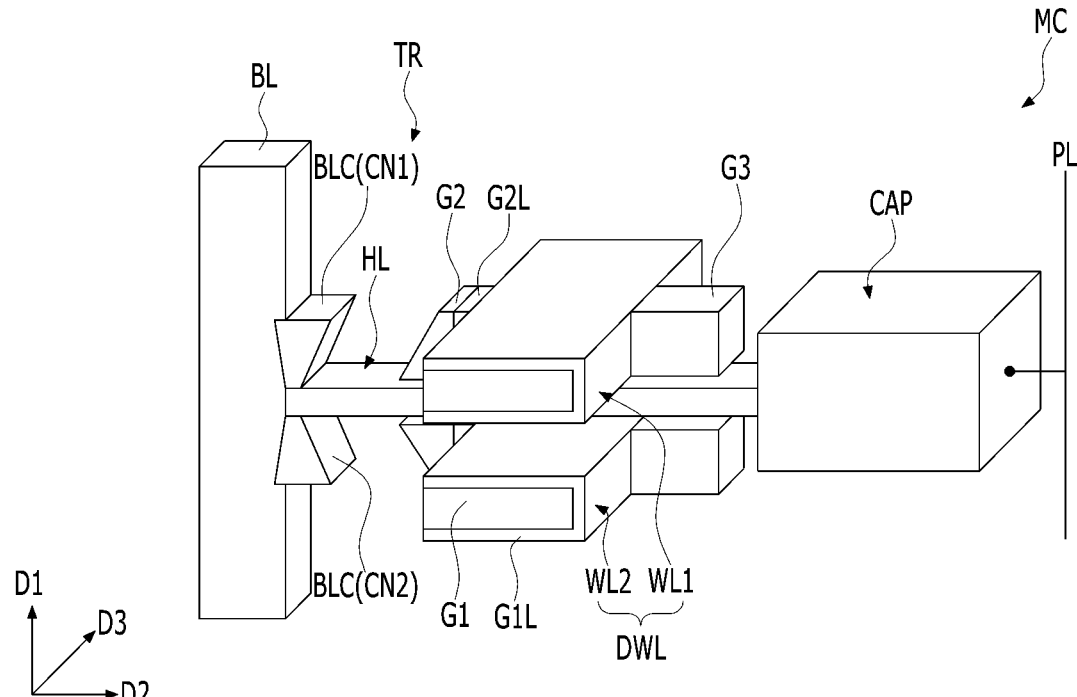
FIG. 1A is a perspective view schematically illustrating a memory cell in accordance with one embodiment.

Various embodiments described herein may be described with reference to cross-sectional views, plan views and block diagrams, which are ideal schematic views of a semiconductor device. It is noted that the structures of the drawings may be modified by fabricating techniques and/or tolerances. The present disclosure is not limited to the described embodiments and the specific structures illustrated in the drawings, but may include other embodiments, or modifications of the described embodiments including any changes in the structures that may be produced according to requirements of the fabricating process. Accordingly, the regions illustrated in the drawings have schematic attributes, and the shapes of the regions illustrated in the drawings are intended to illustrate specific structures of regions of the elements, and are not intended to limit the scope of the disclosure.

In embodiments described below, memory cells may be vertically stacked so that memory cell density may increase and parasitic capacitance may be reduced.

Embodiments described below relate to a three-dimensional (3D) memory cell, and a horizontal conductive line (a word line or a gate electrode) may include a low work function electrode and a high work function electrode. The low work function electrode may be adjacent to a data storage element (for example, a capacitor) and a vertical conductive line (or a bit line), and the high work function electrode may overlap a channel of a horizontal layer.

Due to a low work function of the low work function electrode, a low electric field may be formed between the horizontal conductive line and the data storage element, thereby making it possible to improve leakage current.

Due to a high work function of the high work function electrode, a low electric field as well as a high threshold voltage of a switching element may be formed, thereby making it possible to reduce the height of a memory cell, which is advantageous in terms of integration.

Figure 1B:
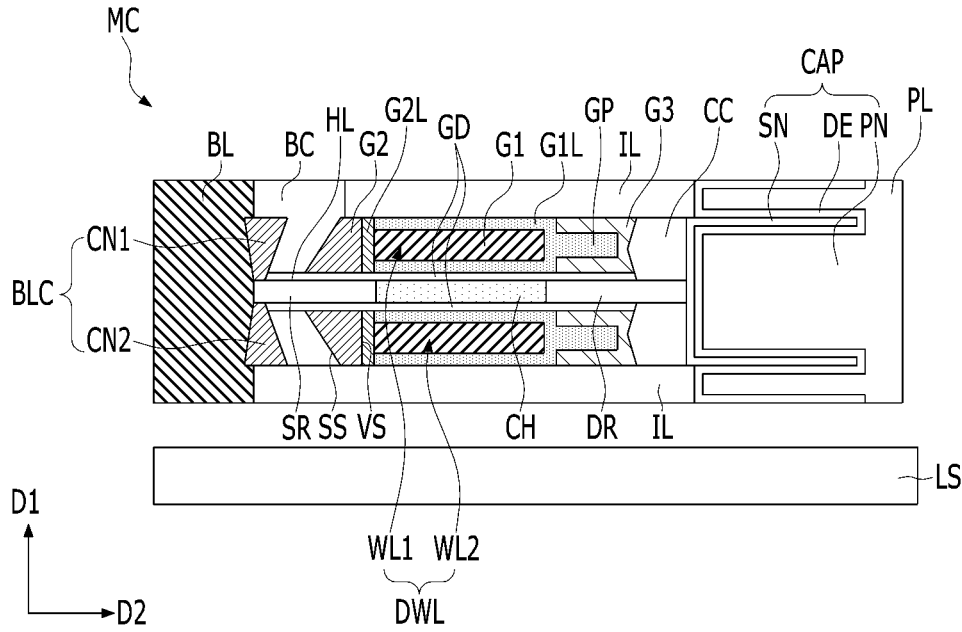
FIG. 1B is a cross-sectional view schematically illustrating the memory cell illustrated in FIG. 1A.

FIG. 1A is a perspective view schematically illustrating a memory cell MC in accordance with an embodiment. FIG. 1B is a cross-sectional view schematically illustrating the memory cell MC illustrated in FIG. 1A.

Referring to FIGS. 1A and 1B, the memory cell MC may include a vertical conductive line BL, a switching element TR, and a data storage element CAP. The switching element TR may include a horizontal layer HL, a gate insulating layer GD, and a horizontal conductive line DWL. The data storage element CAP may include a memory element such as a capacitor. The vertical conductive line BL may include a bit line. The horizontal conductive line DWL may include a word line, and the horizontal layer HL may include an active layer. The data storage element CAP may include a first electrode SN, a dielectric layer DE, and a second electrode PN. The switching element TR may include a transistor, and in this case, the horizontal conductive line DWL may serve as a gate electrode. The switching element TR may also be referred to as an access element or a selection element.

The vertical conductive line BL may vertically extend along a first direction D1. The horizontal layer HL may extend along a second direction D2 crossing the first direction D1. The horizontal conductive line DWL may extend along a third direction D3 crossing the first and second directions D1 and D2.

The vertical conductive line BL may be vertically oriented along the first direction D1. The vertical conductive line BL may be referred to as a vertically-oriented bit line, a vertically-extended bit line, or a pillar-shaped bit line. The vertical conductive line BL may include a conductive material. The vertical conductive line BL may include for example a silicon-based material, a metal-based material, or a combination thereof. The vertical conductive line BL may include for example polysilicon, metal, metal nitride, metal silicide, or combinations thereof. The vertical conductive line BL may include polysilicon, titanium nitride, tungsten, or combinations thereof. For example, the vertical conductive line BL may include polysilicon or titanium nitride (TIN) doped with an N-type impurity. The vertical conductive line BL may include a stack of titanium nitride and tungsten (TiN/W).

The switching element TR may include a transistor, and thus, the horizontal conductive line DWL may be referred to as a horizontal gate line or a horizontal word line. A first horizontal conductive line WL1 and a second horizontal conductive line WL2 included in the horizontal conductive line DWL may have the same potential. For example, the first horizontal conductive line WL1 and the second horizontal conductive line WL2 may form a pair and be coupled to one memory cell MC. The same driving voltage (or different driving voltages) may be applied to the first horizontal conductive line WL1 and the second horizontal conductive line WL2.

The horizontal conductive line DWL may extend lengthwise along the third direction D3, and the horizontal layer HL may extend along the second direction D2. The horizontal layer HL may be horizontally arranged from the vertical conductive line BL. The horizontal conductive line DWL may have a double structure. For example, the horizontal conductive line DWL may include the first and second horizontal conductive lines WL1 and WL2 facing each other with the horizontal layer HL interposed therebetween. The gate insulating layer GD may be formed on upper and lower surfaces of the horizontal layer HL. The first horizontal conductive line WL1 may be disposed over the horizontal layer HL, and the second horizontal conductive line WL2 may be disposed below the horizontal layer HL. The horizontal conductive line DWL may include a pair of the first horizontal conductive line WL1 and the second horizontal conductive line WL2.

The horizontal layer HL may extend along the second direction D2. The horizontal layer HL may include a semiconductor material. For example, the horizontal layer HL may include for example polysilicon, monocrystalline silicon, germanium, or silicon-germanium. In another embodiment, the horizontal layer HL may include an oxide semiconductor material. In one example, the oxide semiconductor material may include indium gallium zinc oxide (IGZO).

The upper and lower surfaces of the horizontal layer HL may each have a flat surface. That is, the upper and lower surfaces of the horizontal layer HL may be parallel to each other along the second direction D2.

The horizontal layer HL may include a channel CH, a first doped region SR between the channel CH and the vertical conductive line BL, and a second doped region DR between the channel CH and the data storage element CAP. When the horizontal layer HL is formed of an oxide semiconductor material, the channel CH may be formed of an oxide semiconductor material, and the first and second doped regions SR and DR may be omitted. The horizontal layer HL may also be referred to as an active layer or a thin-body.

The first doped region SR and the second doped region DR may be doped with the same conductive type impurity. The first doped region SR and the second doped region DR may be doped with an N-type impurity or a P-type impurity. The first doped region SR and the second doped region DR may include for example arsenic (As), phosphorus (P), boron (B), indium (In), and at least one impurity selected from combinations thereof. The first doped region SR may be coupled to the vertical conductive line BL, and the second doped region DR may be coupled to the first electrode SN of the data storage element CAP.

The gate insulating layer GD may include for example silicon oxide, silicon nitride, metal oxide, metal oxide nitride, metal silicate, a high-k material, a ferroelectric material, an anti-ferroelectric material, or combinations thereof. The gate insulating layer GD may include for example $SiO_2$, $Si_3N_4$, $HfO_2$, $Al_2O_3$, $ZrO_2$, AlON, HfON, HfSiO, HfSiON, or combinations thereof.

The horizontal conductive line DWL may include a metal, a metal mixture, a metal alloy, or a semiconductor material. The horizontal conductive line DWL may include for example titanium nitride, tungsten, molybdenum, ruthenium, polysilicon, or combinations thereof. In one example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of 4.5 eV or lower, and the P-type work function material may have a high work function of 4.5 eV or higher.

Each of the first and second horizontal conductive lines WL1 and WL2 may include a first work function electrode G1, a second work function electrode G2, and a third work function electrode G3. The first work function electrode G1, the second work function electrode G2 and the third work function electrode G3 may be horizontally disposed along the second direction D2. The first work function electrode G1, the second work function electrode G2 and the third work function electrode G3 may be parallel to one another while directly contacting one another. The second work function electrode G2 may be adjacent to (or otherwise between the first work function electrode G1 and) the vertical conductive line BL, and the third work function electrode G3 may be adjacent to (or otherwise between the first work function electrode G1 and) the data storage element CAP. The horizontal layer HL may have a smaller thickness than the first, second and third work function electrodes G1, G2 and G3.

The first work function electrode G1, the second work function electrode G2 and the third work function electrode G3 may include for example titanium nitride, tungsten, molybdenum, ruthenium, polysilicon, or combinations thereof.

In one embodiment, the first work function electrode G1, the second work function electrode G2 and the third work function electrode G3 are formed of different work function materials, although second work function electrode G2 and third work function electrode G3 may be formed of the same work function material. The first work function electrode G1 may have a higher work function than the second and third work function electrodes G2 and G3. The first work function electrode G1 may include a high work function material. The first work function electrode G1 may have a work function higher than a mid-gap work function of silicon. The second and third work function electrodes G2 and G3 may each include a low work function material. The second and third work function electrodes G2 and G3 may each have a work function lower than the mid-gap work function of silicon. Specifically, the high work function material may have a work function higher than 4.5 eV, and the low work function material may have a work function lower than 4.5 eV. The first work function electrode G1 may include a metal-based material, and the second and third work function electrodes G2 and G3 may each include a semiconductor material.

The second and third work function electrodes G2 and G3 may each include N-type dopant doped polysilicon. The first work function electrode G1 may include a metal, a metal nitride, or a combination thereof. The first work function electrode G1 may include for example tungsten, titanium nitride, molybdenum, ruthenium, or combinations thereof. A barrier material may be further formed between the second and third work function electrodes G2 and G3 and the first work function electrode G1.

In one embodiment, in each of the first and second horizontal conductive lines WL1 and WL2 of the horizontal conductive line DWL, the second work function electrode G2, the first work function electrode G1 and the third work function electrode G3 may be horizontally disposed in this order along the second direction D2. The first work function electrode G1 may include metal, and the second work function electrode G2 and the third work function electrode G3 may each include polysilicon.

Each of the first and second horizontal conductive lines WL1 and WL2 of the horizontal conductive line DWL may have a poly Si-metal-poly Si (PMP) structure horizontally disposed along the second direction D2. In the PMP structure, the first work function electrode G1 may be a metal-based material, and the second and third work function electrodes G2 and G3 may each be N-type dopant doped polysilicon. The N-type dopant may include phosphorus or arsenic.

A first barrier layer G1L may be disposed between the first work function electrode G1 and the third work function electrode G3. The first barrier layer G1L may include for example titanium nitride, tantalum nitride, tungsten nitride, or molybdenum nitride. The first barrier layer G1L may surround a portion of the first work function electrode G1. The first barrier layer G1L may include a protrusion GP that fills an inner side surface of the third work function electrode G3. In one embodiment, the third work function electrode G3, which has a bent shape, may include the inner side surface covering the protrusion GP of the first barrier layer G1L and may include an outer side surface contacting the first electrode SN.

A second barrier layer G2L may be disposed between the first work function electrode G1 and the second work function electrode G2. The second barrier layer G2L may include for example titanium nitride, tantalum nitride, tungsten nitride, or molybdenum nitride. The first work function electrode G1 may include for example tungsten, molybdenum, or aluminum. The second barrier layer G2L may include a flat inner side surface and a flat outer side surface, as illustrated in FIG. 1B. The flat inner side surface of the second barrier layer G2L may contact the first work function electrode G1, and the flat outer side surface of the second barrier layer G2L may contact the second work function electrode G2.

The second work function electrode G2 may include a vertical side VS and a sloped side SS, as also illustrated in FIG. 1B. The vertical side VS of the second work function electrode G2 may contact the second barrier layer G2L. The sloped side SS of the second work function electrode G2 may face the vertical conductive line BL. Accordingly, since an area where the vertical conductive line BL and the second work function electrode G2 face each other is reduced, the capacitance between the horizontal conductive line DWL and the vertical conductive line BL may be reduced. The second work function electrode G2 may be referred to as a sloped gate.

The first work function electrode G1 may have a larger volume than the second and third work function electrodes G2 and G3, and thus the horizontal conductive line DWL may have a low resistance. The first work function electrodes G1 of the first and second horizontal conductive lines WL1 and WL2 may vertically overlap along the first direction D1 with the horizontal layer HL interposed therebetween. The second and third work function electrodes G2 and G3 of the first and second horizontal conductive lines WL1 and WL2 may vertically overlap along the first direction D1 with the horizontal layer HL interposed therebetween. An overlapping area between the first work function electrode G1 and the horizontal layer HL may be greater than an overlapping area between the second and third work function electrodes G2 and G3 and the horizontal layer HL. The second and third work function electrodes G2 and G3 and the first work function electrode G1 may extend along the third direction D3, and the second and third work function electrodes G2 and G3 and the first work function electrode G1 may directly contact one another.

As described above, each of the first and second horizontal conductive lines WL1 and WL2 may have a triple electrode structure including the first, second and third work function electrodes G1, G2 and G3. The horizontal conductive line DWL may have a pair of the first work function electrodes G1, a pair of the second work function electrodes G2 and a pair of the third work function electrodes G3, which extend along the third direction D3 crossing the horizontal layer HL, with the horizontal layer HL interposed therebetween. The first work function electrodes G1 of the horizontal conductive line DWL may vertically overlap with the channel CH, the second work function electrodes G2 of the horizontal conductive line DWL may vertically overlap with the first doped region SR of the horizontal layer HL, and the third work function electrodes G3 of the horizontal conductive line DWL may vertically overlap with the second doped region DR of the horizontal layer HL.

As the first work function electrode G1 having a high work function is disposed at the center of the horizontal conductive line DWL, and the second and third work function electrodes G2 and G3 each having a low work function are disposed at both ends of the horizontal conductive line DWL, leakage current such as gate induced drain leakage (GIDL) may be improved.

As the first work function electrode G1 having a high work function is disposed at the center of the horizontal conductive line DWL, a threshold voltage of the switching element TR may increase. Since the second work function electrode G2 of the horizontal conductive line DWL has a low work function, a low electric field may be formed between the vertical conductive line BL and the horizontal conductive line DWL. Since the third work function electrode G3 of the horizontal conductive line DWL has a low work function, a low electric field may be formed between the data storage element CAP and the horizontal conductive line DWL.

The data storage element CAP may be horizontally disposed along the second direction D2 from the switching element TR. The data storage element CAP may include the first electrode SN horizontally extending from the horizontal layer HL along the second direction D2. The data storage element CAP may further include the second electrode PN on the first electrode SN and the dielectric layer DE between the first electrode SN and the second electrode PN. The first electrode SN, the dielectric layer DE and the second electrode PN may be horizontally arranged along the second direction D2. The first electrode SN may have a horizontally-oriented cylindrical shape. The dielectric layer DE may conformally cover a cylindrical inner wall and a cylindrical outer wall of the first electrode SN. The second electrode PN may be disposed on the dielectric layer DE and cover the cylindrical inner wall and the cylindrical outer wall of the first electrode SN. The first electrode SN may be electrically coupled to the second doped region DR.

The first electrode SN may have a 3D structure, and the first electrode SN having the 3D structure may have a horizontal 3D structure oriented along the second direction D2. As an example of the 3D structure, the first electrode SN may have a cylindrical shape. In another embodiment, the first electrode SN may have a pillar shape or a pylinder shape. The pylinder shape may be referred to as a structure in which a pillar shape and a cylindrical shape are merged.

The first electrode SN and the second electrode PN may each include for example a metal, a noble metal, metal nitride, conductive metal oxide, conductive noble metal oxide, metal carbide, metal silicide, or combinations thereof. In one embodiment, the first electrode SN and the second electrode PN may each include for example titanium (Ti), titanium nitride (TiN), tantalum (Ta), tantalum nitride (TaN), tungsten (W), tungsten nitride (WN), ruthenium (Ru), ruthenium oxide (RuO$_2$), iridium (Ir), iridium oxide (IrO$_2$), platinum (Pt), molybdenum (Mo), molybdenum oxide (MoO), a titanium nitride/tungsten (TiN/W) stack, or a tungsten nitride/tungsten (WN/W) stack or a combination thereof. The second electrode PN may also include a combination of a metal-based material and a silicon-based material. In one example, the second electrode PN may be a stack of titanium nitride, silicon germanium and tungsten nitride (TIN/SiGe/WN). In the stack of titanium nitride, silicon germanium and tungsten nitride (TiN/SiGe/WN), silicon germanium may be a gap-fill material filling the inside of the cylinder of the first electrode SN, titanium nitride (TiN) may serve as the second electrode PN of the data storage element CAP, and the tungsten nitride may be a low-resistance material.

The dielectric layer DE may be referred to as a capacitor dielectric layer or a memory layer. The dielectric layer DE may include for example silicon oxide, silicon nitride, a high-k material, or combinations thereof. The high-k material may have a higher dielectric constant than silicon oxide. Silicon oxide (SiO$_2$) may have a dielectric constant of approximately 3.9, and the dielectric layer DE may include a high-k material having a dielectric constant of 4 or higher. The high-k material may have a dielectric constant of approximately 20 or higher. The high-k material may include for example hafnium oxide (HfO$_2$), zirconium oxide (ZrO$_2$), aluminum oxide (Al$_2$O$_3$), lanthanum oxide (La$_2$O$_3$), titanium oxide (TiO$_2$), tantalum oxide (Ta$_2$O$_5$), niobium oxide (Nb$_2$O$_5$), or strontium titanium oxide (SrTiO$_3$). In another embodiment, the dielectric layer DE may be formed of a composite layer including two or more layers of the above-described high-k material.

The dielectric layer DE may be formed of zirconium-based oxide (Zr-based oxide). The dielectric layer DE may have a stacked structure including zirconium oxide (ZrO$_2$). The dielectric layer DE may include a ZA (ZrO$_2$/Al$_2$O$_3$) stack or a ZAZ (ZrO$_2$/Al$_2$O$_3$/ZrO$_2$) stack. The ZA stack may have a structure in which aluminum oxide (Al$_2$O$_3$) is stacked on zirconium oxide (ZrO$_2$). The ZAZ stack may have a structure in which zirconium oxide (ZrO$_2$), aluminum oxide (Al$_2$O$_3$) and zirconium oxide (ZrO$_2$) are sequentially stacked. Each of the ZA stack and the ZAZ stack may be referred to as a zirconium oxide-based layer (ZrO$_2$-based layer). In another embodiment, the dielectric layer DE may be formed of hafnium-based oxide (Hf-based oxide). The dielectric layer DE may have a stacked structure including hafnium oxide (HfO$_2$). The dielectric layer DE may include an HA (HfO$_2$/Al$_2$O$_3$) stack or an HAH (HfO$_2$/Al$_2$O$_3$/HfO$_2$) stack. The HA stack may have a structure in which aluminum oxide (Al$_2$O$_3$) is stacked on hafnium oxide (HfO$_2$). The HAH stack may have a structure in which hafnium oxide (HfO$_2$), aluminum oxide (Al$_2$O$_3$) and hafnium oxide (HfO$_2$) are sequentially stacked. Each of the HA stack and the HAH stack may be referred to as a hafnium oxide-based layer (HfO$_2$-based layer). In the ZA stack, the ZAZ stack, the HA stack and the HAH stack, aluminum oxide (Al$_2$O$_3$) may have a larger band gap than zirconium oxide (ZrO$_2$) and hafnium oxide (HfO$_2$). Aluminum oxide (Al$_2$O$_3$) may have a lower dielectric constant than zirconium oxide (ZrO$_2$) and hafnium oxide (HfO$_2$). Accordingly, the dielectric layer DE may include a stack of a high-k material and a high band gap material having a larger band gap than the high-k material. The dielectric layer DE may include silicon oxide (SiO$_2$) as a high band gap material other than aluminum oxide (Al$_2$O$_3$). The dielectric layer DE includes the high band gap material, and thus leakage current thereof may be suppressed. The high band gap material may be thinner than the high-k material. In another embodiment, the dielectric layer DE may include a laminated structure in which the high-k material and the high band gap material are alternately stacked. For example, the dielectric layer DE may include a ZAZA (ZrO$_2$/Al$_2$O$_3$/ZrO$_2$/Al$_2$O$_3$) stack, a ZAZAZ (ZrO$_2$/Al$_2$O$_3$/ZrO$_2$/Al$_2$O$_3$/ZrO$_2$) stack, a HAHA (HfO$_2$/Al$_2$O$_3$/HfO$_2$/Al$_2$O$_3$) stack, or a HAHAH (HfO$_2$/Al$_2$O$_3$/HfO$_2$/Al$_2$O$_3$/HfO$_2$) stack. In the laminated structure, aluminum oxide (Al$_2$O$_3$) may be thinner than zirconium oxide (ZrO$_2$) and hafnium oxide (HfO$_2$).

In another embodiment, the dielectric layer DE may include a stacked structure, a laminated structure, or an intermixed structure, each including zirconium oxide, hafnium oxide and aluminum oxide.

In another embodiment, an interface control layer for improving leakage current may be further formed between the first electrode SN and the dielectric layer DE. The interface control layer may include for example titanium oxide (TiO$_2$), tantalum oxide (Ta$_2$O$_5$), or niobium oxide (Nb$_2$O$_5$). The interface control layer may also be formed between the second electrode PN and the dielectric layer DE.

The data storage element CAP may include a metal-insulator-metal (MIM) capacitor. The first electrode SN and the second electrode PN may each include a metal-based material.

The data storage element CAP may be replaced with another data storage material. For example, the data storage material may be a phase change material, a magnetic tunnel junction (MTJ), or a variable resistance material.

A contact node BLC may be formed between the first doped region SR and the vertical conductive line BL. The contact node BLC may include N-type dopant doped polysilicon. The first doped region SR may include dopants diffused from the contact node BLC.

The contact node BLC may include a pair of first and second contact nodes CN1 and CN2. The first contact node CN1 may be formed on an upper edge of the first doped region SR, and the second contact node CN2 may be formed on a lower edge of the first doped region SR. The first doped region SR may be disposed between the first contact node CN1 and the second contact node CN2. The first contact node CN1, the second contact node CN2 and the first doped region SR may be electrically coupled. The first and second contact nodes CN1 and CN2 may directly contact the vertical conductive line BL.

In another embodiment, an ohmic contact may be formed between the contact node BLC and the vertical conductive line BL. The ohmic contact may include a metal silicide.

In another embodiment, an additional contact node may be formed between the second doped region DR and the first electrode SN of the data storage element CAP. The additional contact node may include an N-type dopant doped polysilicon. The second doped region DR may include dopants diffused from the additional contact node.

A first capping layer BC may be disposed between the contact node BLC and the second work function electrode G2. A second capping layer CC may be disposed between the third work function electrode G3 and the first electrode SN. The first and second capping layers BC and CC may each include an insulating material. The first and second capping layers BC and CC may each include for example silicon oxide, silicon nitride, SiCN, SiCO, SiCON, or combinations thereof.

As described above, the memory cell MC may include the horizontal conductive line DWL having a triple work function electrode structure. Each of the first and second horizontal conductive lines WL1 and WL2 of the horizontal conductive line DWL may include the first work function electrode G1, the second work function electrode G2 and the third work function electrode G3. The first work function electrode G1 may overlap the channel CH, the second work function electrode G2 may be adjacent to the vertical conductive line BL and the first doped region SR, and the third work function electrode G3 may be adjacent to the data storage element CAP and the second doped region DR. Due to a low work function of the second work function electrode G2, a low electric field is formed between the horizontal conductive line DWL and the vertical conductive line BL, thereby making it possible to reduce leakage current. Due to a low work function of the third work function electrode G3, a low electric field is formed between the horizontal conductive line DWL and the data storage element CAP, thereby making it possible to reduce leakage current. A high work function of the first work function electrode G1 may increase the threshold voltage of the switching element TR. In addition, since the high work function of the first work function electrode G1 forms a low electric field, the height of the memory cell MC can be reduced, which is advantageous in terms of integration.

As a first comparative example, when each of the first and second horizontal conductive lines WL1 and WL2 is formed of only a metal-based material, a high electric field is formed between the first and second horizontal conductive lines WL1 and WL2 and the data storage element CAP due to the relatively high work function of the metal-based material compared to semiconductor or silicide based materials, which causes an increase in leakage current of the memory cell MC. The increase in leakage current due to the high electric field intensifies as the channel CH becomes thinner.

As a second comparative example, when each of the first and second horizontal conductive lines WL1 and WL2 is formed of only a low work function material, the threshold voltage of the switching element TR decreases due to the low work function, resulting in leakage current.

In one embodiment, since each of the first and second horizontal conductive lines WL1 and WL2 of the horizontal conductive line DWL has a triple electrode structure, leakage current may be decreased, and thus refresh characteristics of the memory cell MC may be secured, which leads to low power consumption.

In addition, in this embodiment, since each of the first and second horizontal conductive lines WL1 and WL2 of the horizontal conductive line DWL has a triple electrode structure, the triple electrode structure is relatively advantageous in reducing an increase in an electric field even though the thickness of the channel CH is reduced for higher integration, and therefore a higher number of stacked layers in the same volume may be realized.

Figure 2A:
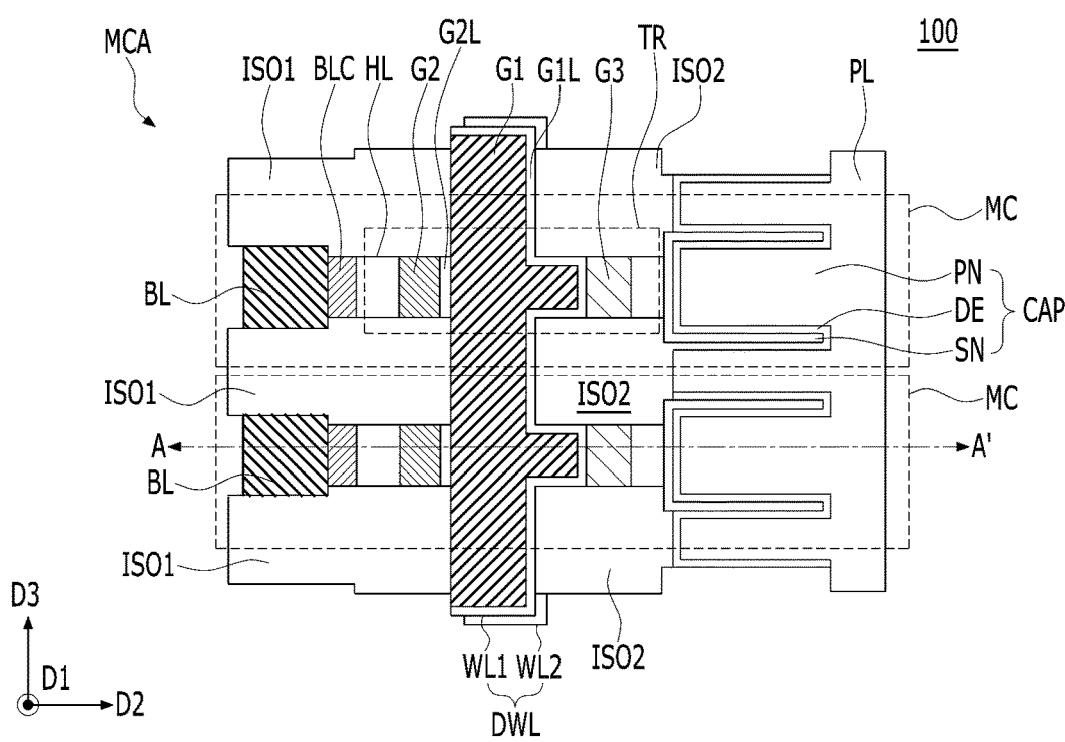
FIG. 2A is a plan view schematically illustrating a semiconductor device.
Figure 2B:
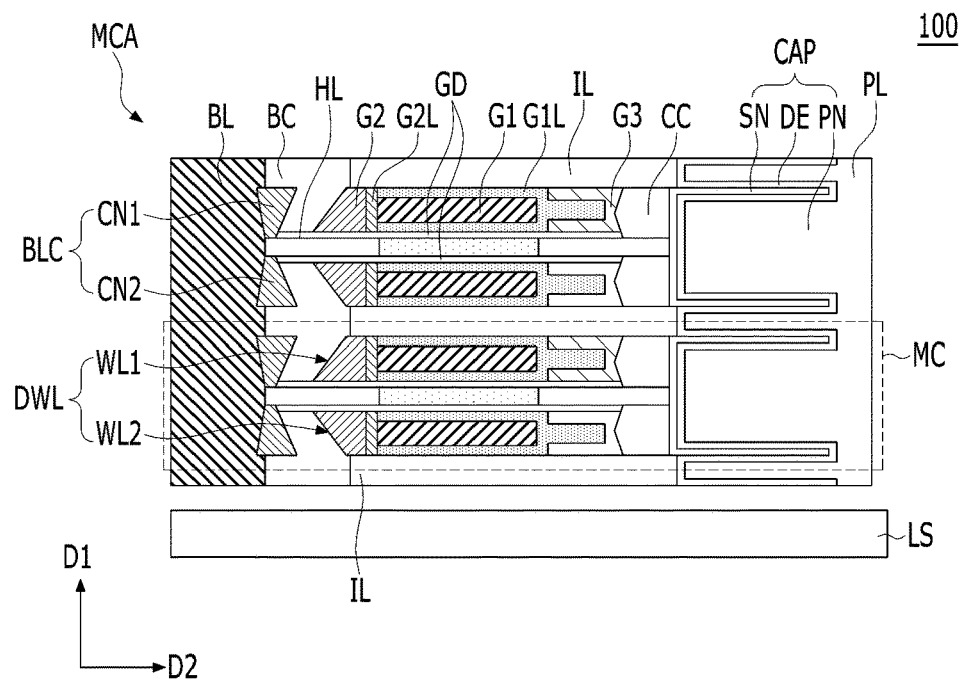
FIG. 2B is a cross-sectional view illustrating the semiconductor device taken along line A-A' illustrated in FIG. 2A.

FIG. 2A is a plan view schematically illustrating a semiconductor device 100. FIG. 2B is a cross-sectional view illustrating the semiconductor device 100 taken along line A-A' illustrated in FIG. 2A.

Referring to FIGS. 2A and 2B, the semiconductor device 100 may include a lower structure LS and a memory cell array MCA. The memory cell array MCA may include a 3D array of memory cells MC. The 3D array of the memory cells MC may include a column array of the memory cells MC and a row array of the memory cells MC. The column array of the memory cells MC may include a plurality of memory cells MC stacked along a first direction D1, and the row array of memory cells MC may include a plurality of memory cells MC horizontally disposed along a third direction D3. In some embodiments, cell insulating layers may be disposed between the memory cells MC stacked along the first direction D1. Isolation layers ISO1 and ISO2 may be disposed between the memory cells MC along the third direction D3. The isolation layers ISO1 and ISO2 may include first isolation layers ISO1 and second isolation layers ISO2. The first isolation layers ISO1 may be disposed between vertical conductive lines BL along the third direction D3, and the second isolation layers ISO2 may be disposed between horizontal conductive lines DWL and data storage elements CAP along the second direction D2.

Each of the memory cells MC may include a vertical conductive line BL, a switching element TR, and a data storage element CAP. The switching element TR, which is a transistor, may include a horizontal layer HL, a gate insulating layer GD, and a horizontal conductive line DWL. Similar to that shown in FIG. 1B, the horizontal layer HL in FIG. 2B may include a first doped region SR, a second doped region DR, and a channel CH between the first doped region SR and the second doped region DR. The horizontal conductive line DWL may include a pair of a first horizontal conductive line WL1 and a second horizontal conductive line WL2. Each of the first horizontal conductive line WL1 and the second horizontal conductive line WL2 may include a first work function electrode G1, a second work function electrode G2, and a third work function electrode G3. The data storage element CAP may include a first electrode SN, a second electrode PN, and a dielectric layer DE between the first electrode SN and the second electrode PN.

The column array of the memory cells MC may include a plurality of switching elements TR stacked along the first direction D1, and the row array of the memory cells MC may include a plurality of switching elements TR horizontally disposed along the third direction D3.

The horizontal layers HL may be stacked over the lower structure LS along the first direction D1, and may be spaced apart from the lower structure LS and extend along a second direction D2 parallel to a surface of the lower structure LS.

The vertical conductive line BL may extend along the first direction D1 perpendicular to the surface of the lower structure LS, and may be coupled to one ends of the horizontal layers HL.

The data storage elements CAP may be coupled to the other ends of the horizontal layers HL, respectively.

The horizontal conductive lines DWL may be stacked along the first direction D1 over the lower structure LS, and may be spaced apart from the lower structure LS and extend along the third direction D3 parallel to the surface of the lower structure LS.

The second electrodes PN of the data storage elements CAP may be coupled to a common plate PL. The horizontal layers HL of the switching elements TR horizontally disposed along the third direction D3 may share one horizontal conductive line DWL. The horizontal layers HL of the switching elements TR horizontally disposed along the third direction D3 may be coupled to different vertical conductive lines BL. The switching elements TR stacked along the first direction D1 may share one vertical conductive line BL. The switching elements TR horizontally disposed along the third direction D3 may share one horizontal conductive line DWL.

The lower structure LS may include a semiconductor substrate or a peripheral circuit unit. The lower structure LS may be disposed at a lower level than the memory cell array MCA. This may be referred to as a cell over peri (COP)

structure. The peripheral circuit unit may include at least one control circuit for driving the memory cell array MCA. At least one control circuit of the peripheral circuit unit may include for example an N-channel transistor, a P-channel transistor, a CMOS circuit, or combinations thereof. At least one control circuit of the peripheral circuit unit may include for example an address decoder circuit, a read circuit, and a write circuit. At least one control circuit of the peripheral circuit unit may include for example a planar channel transistor, a recess channel transistor, a buried gate transistor, and a fin channel transistor (FinFET).

In one example, the peripheral circuit unit may include sub word line drivers and a sense amplifier. The horizontal conductive lines DWL may be coupled to the sub word line drivers. The vertical conductive line BL may be coupled to the sense amplifier.

In another embodiment, the peripheral circuit unit may be disposed at a higher level than the memory cell array MCA. This may be referred to as a peri over cell (POC) structure.

The memory cell array MCA may include the horizontal conductive lines DWL stacked along the first direction D1. Each of the horizontal conductive lines DWL may include a pair of the first horizontal conductive line WL1 and the second horizontal conductive line WL2.

Each of the first and second horizontal conductive lines WL1 and WL2 may include the first work function electrode G1, the second work function electrode G2, and the third work function electrode G3. The first work function electrode G1, the second work function electrode G2 and the third work function electrode G3 may be horizontally disposed along the second direction D2. The first work function electrode G1, the second work function electrode G2 and the third work function electrode G3 may be parallel to one another while directly contacting one another. The second work function electrode G2 may be adjacent to (or otherwise between the first work function electrode G1 and) the vertical conductive line BL, and the third work function electrode G3 may be adjacent to (or otherwise between the first work function electrode G1 and) the data storage element CAP. In one embodiment, the first work function electrode G1, the second work function electrode G2 and the third work function electrode G3 are formed of different work function materials, although G2 and G3 may be formed from the same work function material. The first work function electrode G1 may have a higher work function than the second and third work function electrodes G2 and G3. The first work function electrode G1 may include a high work function material. The first work function electrode G1 may have a work function higher than a mid-gap work function of silicon. The second and third work function electrodes G2 and G3 may each include a low work function material. The second and third work function electrodes G2 and G3 may each have a work function lower than the mid-gap work function of silicon. Specifically, the high work function material may have a work function higher than 4.5 eV, and the low work function material may have a work function lower than 4.5 eV.

The first work function electrode G1 may include a metal-based material, and the second and third work function electrodes G2 and G3 may each include a semiconductor material. The second and third work function electrodes G2 and G3 may each include N-type dopant doped polysilicon. The first work function electrode G1 may include a metal, metal nitride, or a combination thereof. The first work function electrode G1 may include tungsten, titanium nitride, or a combination thereof.

A first barrier layer G1L may be disposed between the first work function electrode G1 and the third work function electrode G3. A second barrier layer G2L may be disposed between the first work function electrode G1 and the second work function electrode G2.

FIGS. 3 to 24 are diagrams illustrating an example of a method for fabricating a semiconductor device in accordance with various embodiments.

Figure 3:
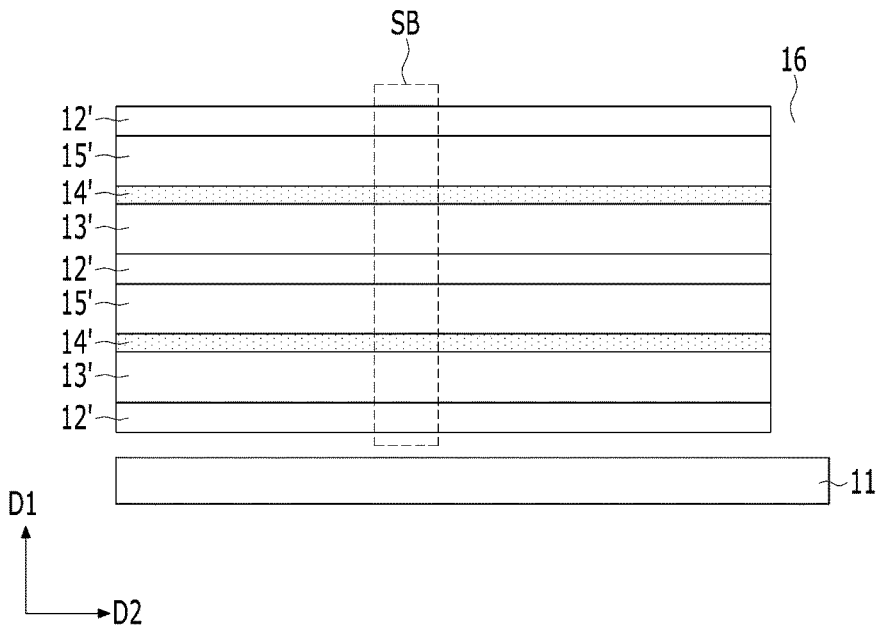
FIGS. 3 to 24 are diagrams illustrating an example of a method for fabricating a semiconductor device in accordance with various embodiments.

As illustrated in FIG. 3, a stack body SB may be formed over a lower structure 11. In the stack body SB, a plurality of sub-stacks may be alternately stacked. An insulating layer 12', a first sacrificial layer 13', a semiconductor layer 14' and a second sacrificial layer 15' may be sequentially stacked in each of the sub-stacks. The insulating layers 12' may each include silicon oxide, and the first and second sacrificial layers 13' and 15' may each include silicon nitride. The semiconductor layer 14' may include a semiconductor material or an oxide semiconductor material. The semiconductor layer 14' may include for example monocrystalline silicon, polysilicon, or indium gallium zinc oxide (IGZO). As described according to the above embodiments, when memory cells are stacked, the stack body SB may be stacked several times.

Subsequently, a portion of the stack body SB may be etched to form a first opening 16. The first opening 16 may vertically extend from a surface of the lower structure 11. Before the first opening 16 is formed, as described above with reference to FIGS. 2A and 2B, the stack body SB may be patterned in units of memory cells.

Figure 4:
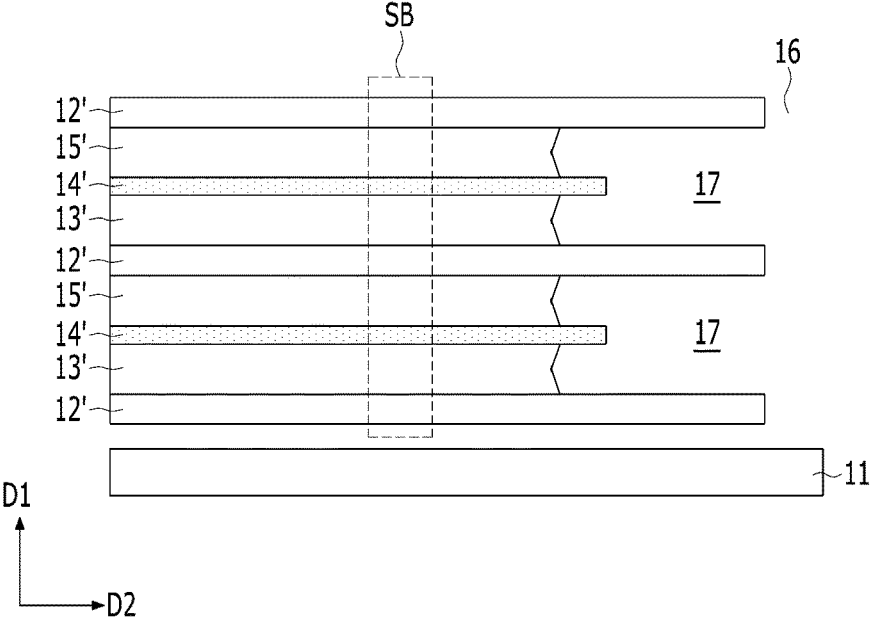

As illustrated in FIG. 4, the first and second sacrificial layers 13' and 15' may be selectively etched through the first opening 16 to form recesses 17. A portion of the semiconductor layer 14' may be exposed by the recesses 17. The recesses 17 may be disposed between the insulating layers 12'.

Subsequently, edges of the semiconductor layers 14' exposed by the recesses 17 may be selectively recessed.

Figure 5:
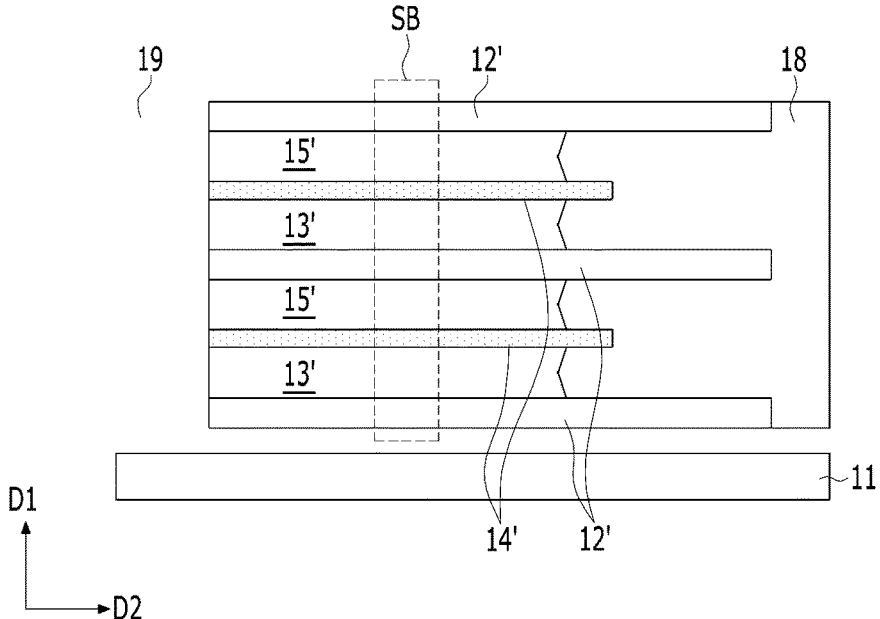

As illustrated in FIG. 5, a sacrificial insulating layer 18 filling the first opening 16 may be formed. The sacrificial insulating layer 18 may include for example silicon oxide, silicon nitride, SiCN, SiCO, SiCON, or combinations thereof.

Subsequently, another portion of the stack body SB may be etched to form a second opening 19.

Figure 6:
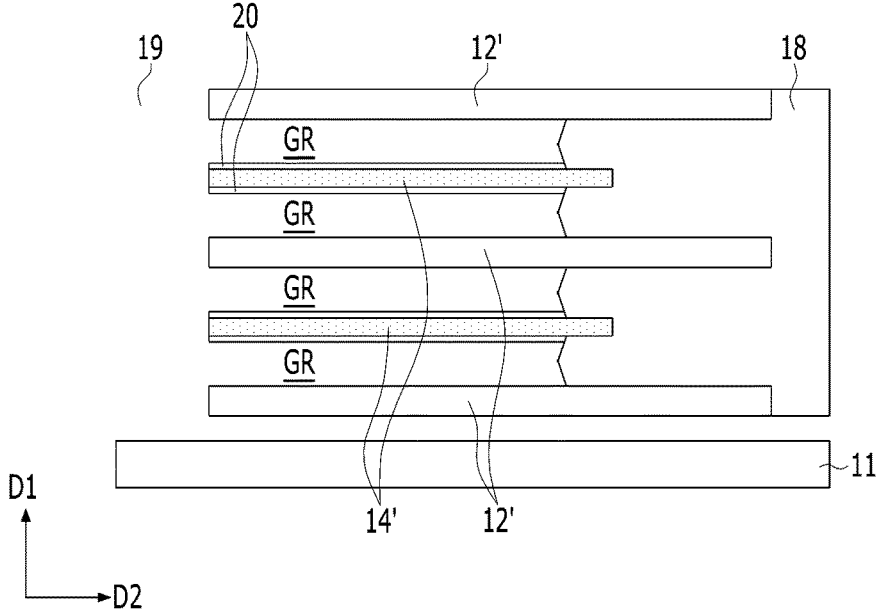

As illustrated in FIG. 6, the first and second sacrificial layers 13' and 15' may be selectively removed through the second opening 19. Accordingly, horizontal recesses GR may be formed above and below the semiconductor layer 14'.

Subsequently, a gate insulating layer 20 may be formed on an exposed portion of the semiconductor layer 14'. The gate insulating layer 20 may include silicon oxide, silicon nitride, metal oxide, metal oxynitride, metal silicate, a high-k material, a ferroelectric material, an anti-ferroelectric material, or combinations thereof. The gate insulating layer 20 may include $SiO_2$, $Si_3N_4$, $HfO_2$, $Al_2O_3$, $ZrO_2$, AlON, HfON, HfSiO, HfSiON, or combinations thereof.

In one embodiment, the gate insulating layer 20 may be formed by an oxidation process, and a portion of the semiconductor layer 14' may be thinned. A thin portion of the semiconductor layer 14' may be referred to as a thin body.

Figure 7:
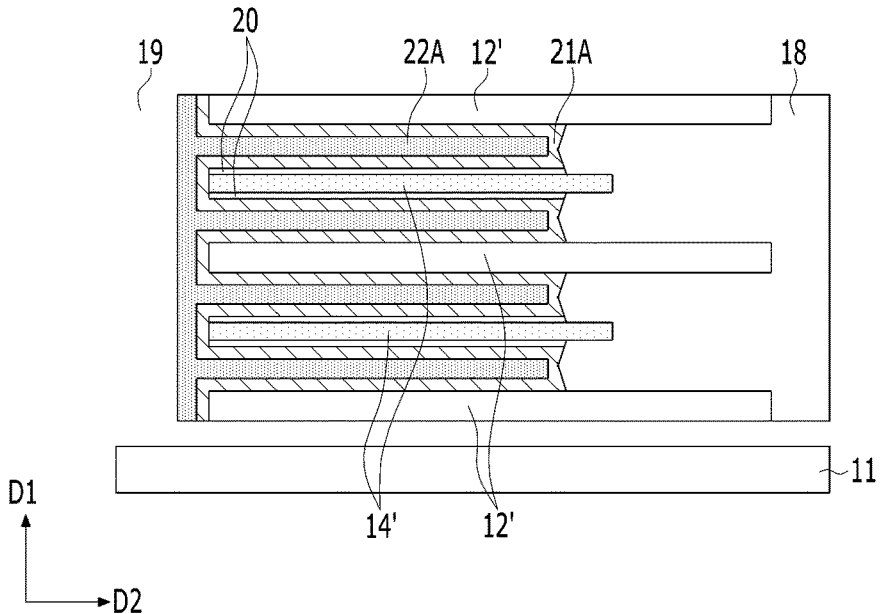

As illustrated in FIG. 7, a first work function material 21A may be conformally formed in the horizontal recesses GR. The first work function material 21A may be disposed on the gate insulating layer 20 and conformally cover the horizontal recesses GR. The first work function material 21A may include a conductive material. The first work function material 21A may have a work function lower than a mid-gap work function of silicon. For example, the first work function material 21A may include N-type dopant doped polysilicon. The N-type dopant may include phosphorus (P) or arsenic (As).

A sacrificial material 22A may be formed between the first work function materials 21A. The sacrificial material 22A may be disposed on the first work function material 21A and fill the horizontal recesses GR. The sacrificial material 22A may have an etch selectivity with respect to the first work function material 21A.

Figure 8:
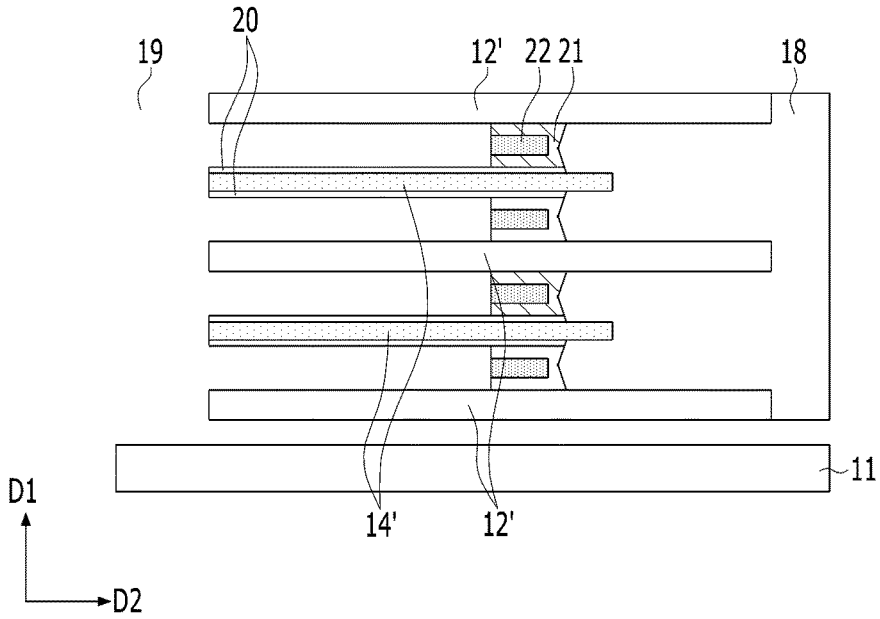

As illustrated in FIG. 8, in order to form a sacrificial pattern 22, the sacrificial material 22A may be selectively recessed.

Subsequently, the first low work function material 21A may be recessed using the sacrificial pattern 22 as a barrier. Accordingly, a first low work function electrode 21 may be formed in the horizontal recesses GR. In order to form the first low work function electrode 21, the first work function material 21A may be selectively etched. For example, a wet etching process may be performed on the first work function material 21A.

A pair of first low work function electrodes 21 may be formed with the semiconductor layer 14' interposed therebetween.

Figure 9:
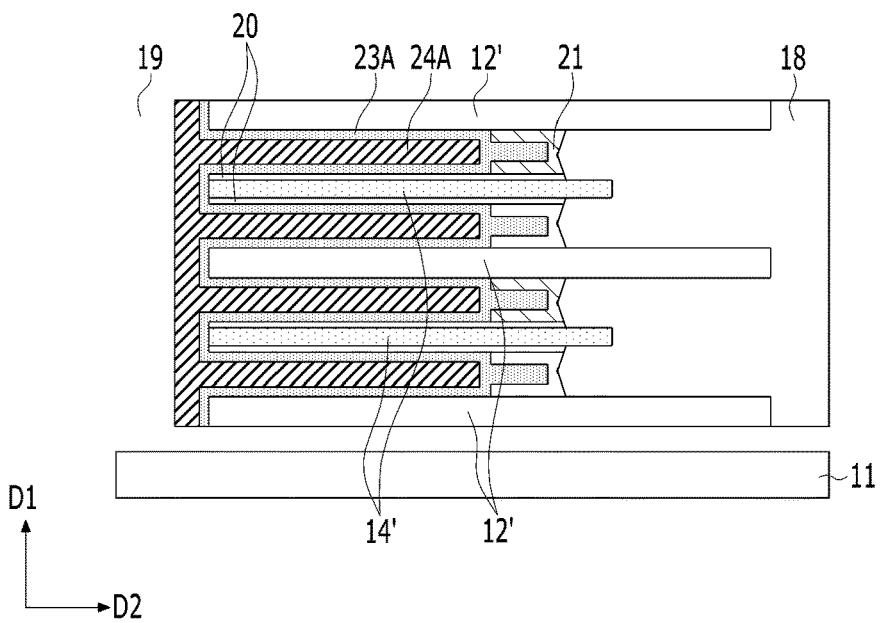

As illustrated in FIG. 9, after the sacrificial pattern 22 is removed, a first barrier material 23A and a work function material 24A may be sequentially formed to gap-fill the other portions of the horizontal recesses GR, on the first low work function electrode 21. The first barrier material 23A may include a metal-based material. The first barrier material 23A may include metal nitride. The second work function material 24A may have a work function higher than the mid-gap work function of silicon. The second work function material 24A may have a higher work function than the first low work function electrode 21. The second work function material 24A may have a lower resistance than the first low work function electrode 21. The second work function material 24A may include a metal-based material. The second work function material 24A may include a metal nitride, a metal, or a combination thereof. The second work function material 24A may include for example titanium nitride, tungsten, or a combination thereof. Titanium nitride and tungsten may be sequentially stacked in the stack of the first barrier material 23A and the second work function material 24A.

Figure 10:
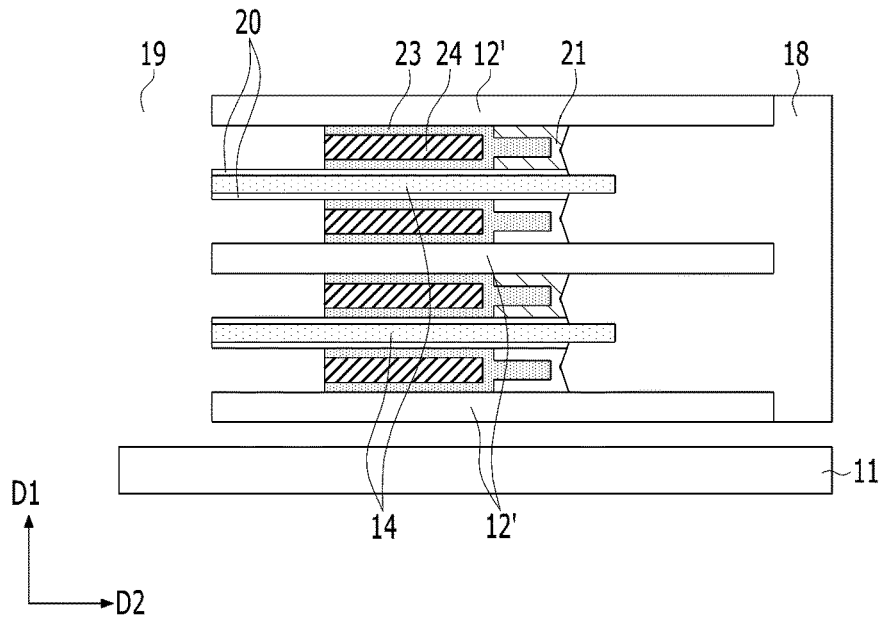

As illustrated in FIG. 10, a first barrier layer 23 and a high work function electrode 24 may be formed in the horizontal recesses GR. In order to form the first barrier layer 23 and the high work function electrode 24, the first barrier material 23A and the second work function material 24A may be selectively etched. For example, each of the first barrier material 23A and the second work function material 24A may be dry-etched or wet-etched.

The high work function electrode 24 may be adjacent to one of the side surfaces of the first low work function electrode 21 with the first barrier layer 23 interposed therebetween. The high work function electrode 24 may have a higher work function than the first low work function electrode 21. The high work function electrode 24 may include a metal-based material. For example, the high work function electrode 24 may include titanium nitride, tungsten, or a combination thereof.

A pair of high work function electrodes 24 may be formed with the semiconductor layer 14' interposed therebetween.

The first low work function electrodes 21 and the high work function electrodes 24 may partially fill the horizontal recesses GR.

Figure 11:
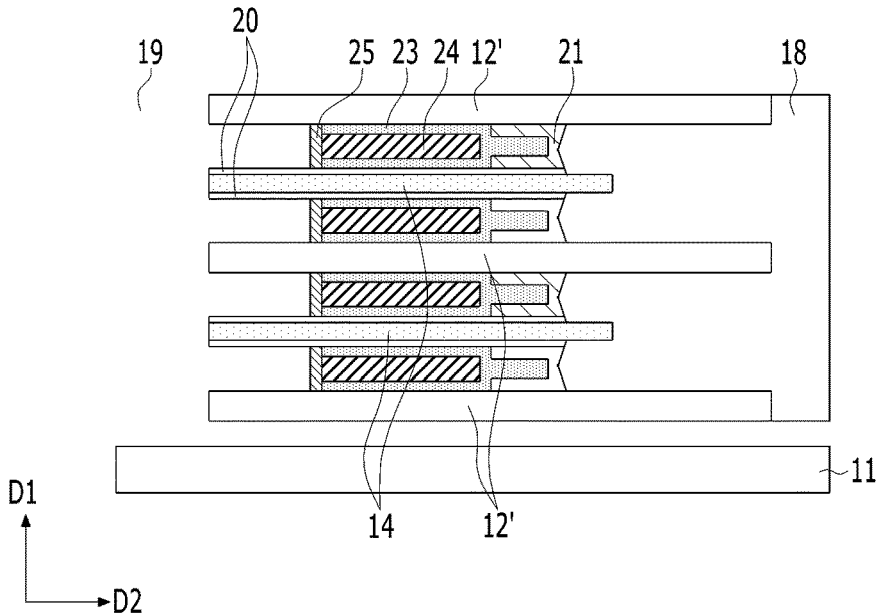

As illustrated in FIG. 11, a second barrier layer 25 may be formed. In the forming of the second barrier layer 25, deposition and etching of a second barrier material may be sequentially performed. The second barrier layer 25 may include a metal-based material. The second barrier layer 25 may include a metal nitride. The second barrier layer 25 may include titanium nitride.

Figure 12:
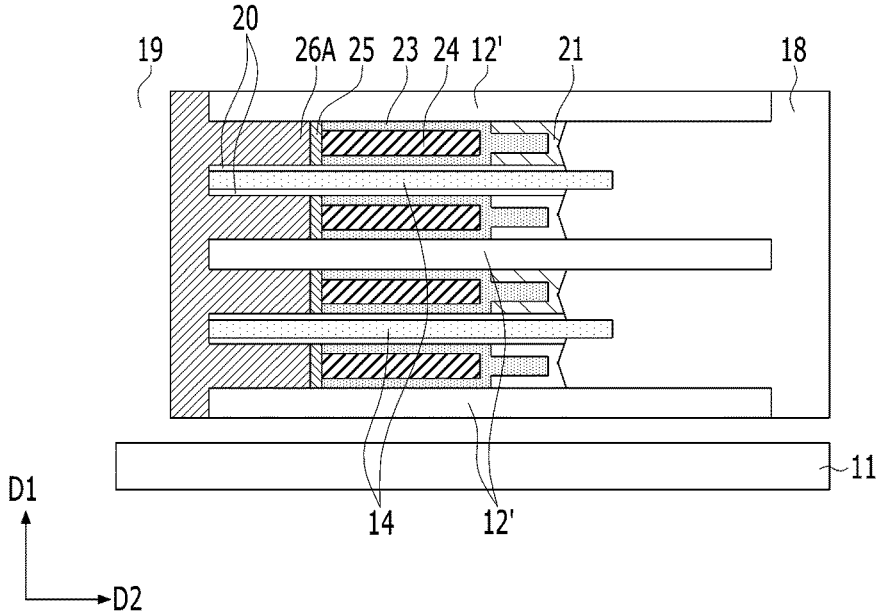

As illustrated in FIG. 12, a third work function material 26A may be formed on the second barrier layer 25. The third work function material 26A may include a conductive material. The third work function material 26A may have a work function lower than the mid-gap work function of silicon. For example, the third work function material 26A may include N-type dopant doped polysilicon. The N-type dopant may include phosphorus (P) or arsenic (As).

Figure 13:
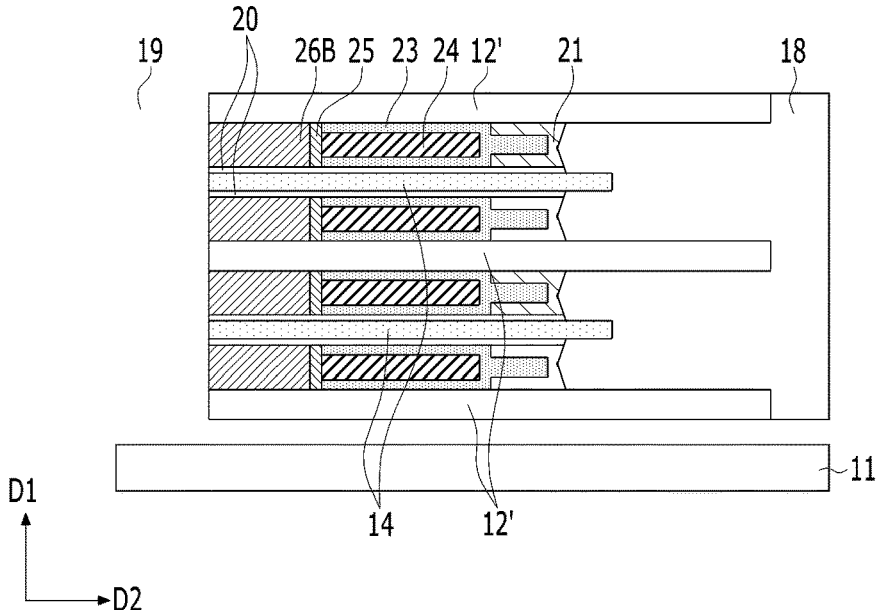

As illustrated in FIG. 13, a third work function material pattern 26B filling the other portions of the horizontal recesses GR may be formed on the second barrier layer 25.

Figure 14:
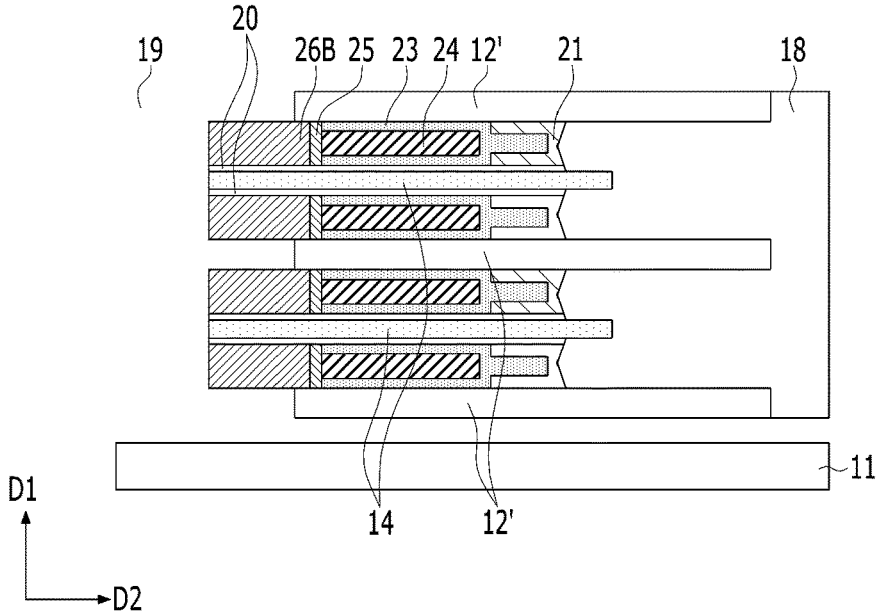

As illustrated in FIG. 14, the insulating layers 12' may be selectively recessed. Accordingly, upper and lower surfaces of the third work function material pattern 26B may be exposed.

Figure 15:
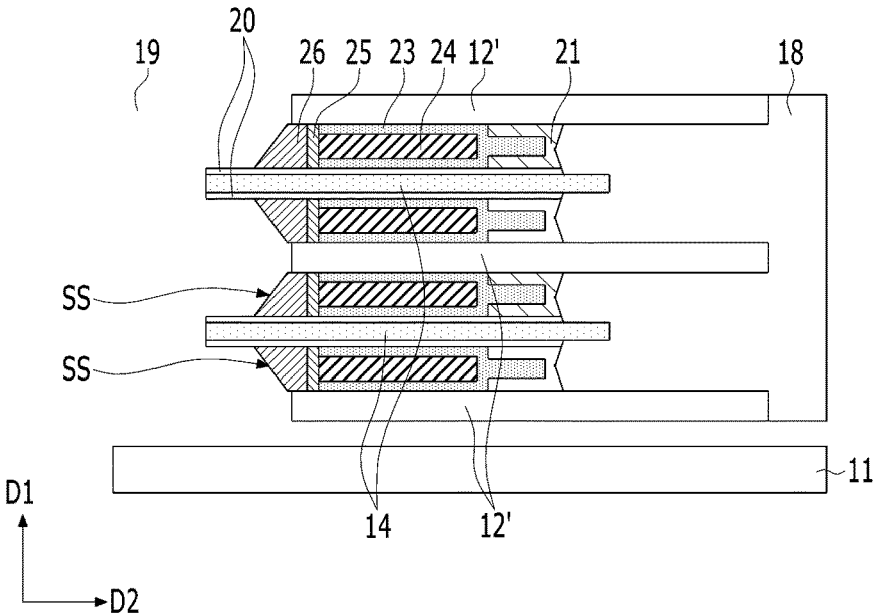

As illustrated in FIG. 15, the third work function material pattern 26B may be selectively etched to form a third work function electrode 26. The third work function electrode 26 may include a slope side surface SS.

Through a series of processes as described above, a pair of first low work function electrodes 21, a pair of high work function electrodes 24 and a pair of second low work function electrodes 26 may be formed with the semiconductor layer 14' interposed between the pairs. The pair of first low work function electrodes 21, the pair of high work function electrodes 24 and the pair of second low work function electrodes 26 may form a horizontal conductive line DWL having a double structure. The first work function electrodes G1 as described with reference to FIGS. 1A to 2B may correspond to the high work function electrodes 24, the second work function electrodes G2 as described with reference to FIGS. 1A to 2B may correspond to the second low work function electrodes 26, and the third work function electrodes G3 as described with reference to FIGS. 1A to 2B may correspond to the first low work function electrodes 21. The high work function electrode 24 may be parallel to the first low work function electrode 21 and may have a higher work function than the first low work function electrode 21, and the second low work function electrode 26 may be parallel to the high work function electrode 24 and may have a lower work function than the high work function electrode 24. The first barrier layer 23 may be disposed between the first low work function electrode 21 and the high work function electrode 24, and the second barrier layer 25 may be disposed between the second low work function electrode 26 and the high work function electrode 24. Mutual diffusion between the high work function electrode 24 and the first and second low work function electrodes 21 and 26 may be prevented or reduced by the first and second barrier layers 23 and 25.

Figure 16:
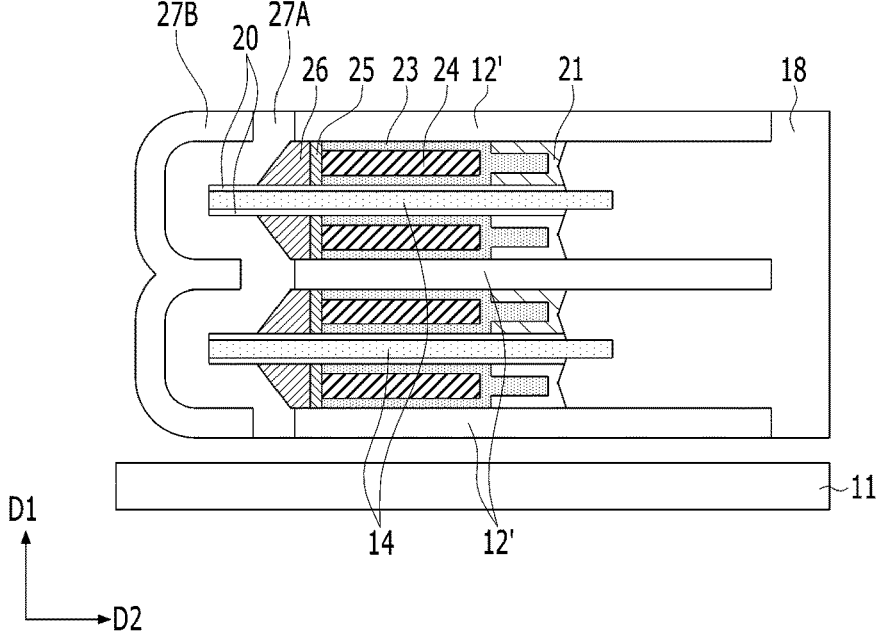

As illustrated in FIG. 16, a first capping material 27A and a second capping material 27B may be sequentially formed. The first and second capping materials 27A and 27B may have different etch selectivities or etch rates. The first and second capping materials 27A and 27B may each include an insulating material. The first and second capping materials 27A and 27B may each include for example silicon oxide, silicon nitride, SiCN, SiCO, SiCON, or combinations thereof. For example, the first capping material 27A may be silicon oxide, and the second capping material 27B may be silicon nitride.

Figure 17:
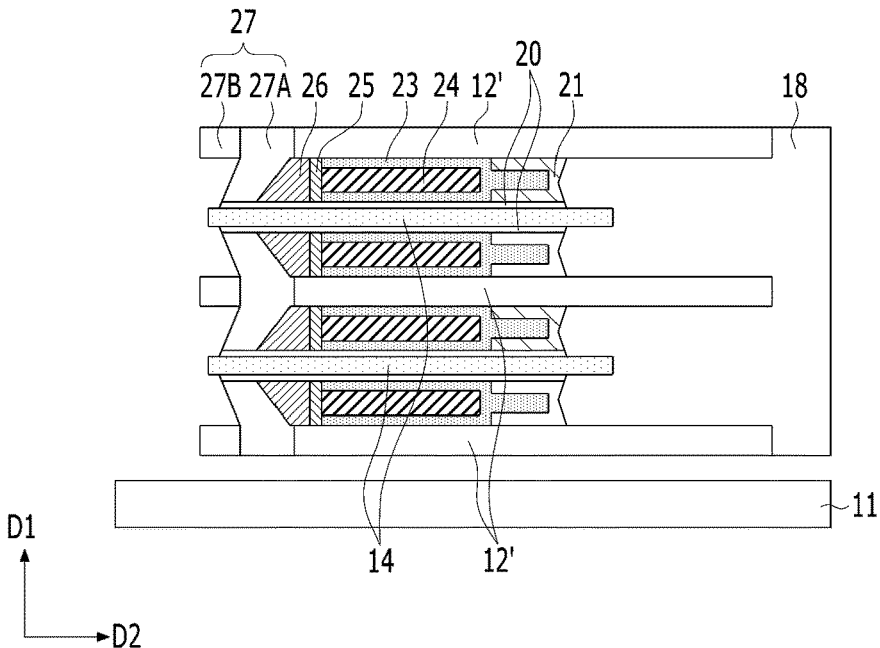

As illustrated in FIG. 17, in order to form a first capping layer 27, the first capping material 27A and the second capping material 27B may be selectively etched. For example, after the second capping material 27B is etched back, the first capping material 27A may be etched back using the second capping material 27B as a barrier.

Figure 18:
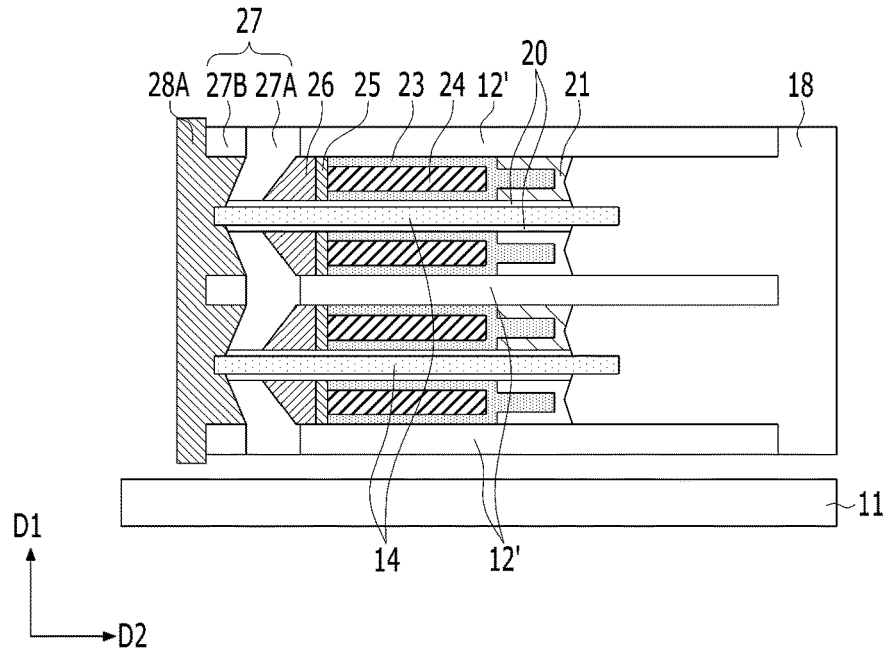

As illustrated in FIG. 18, a contact node material 28A may be formed on the first capping layer 27. The contact node material 28A may include polysilicon doped with an impurity.

In another embodiment, after the contact node material 28A is formed, heat treatment may be performed to form a first doped region (refer to reference numeral "SR" in FIGS. 1A to 2B) in the semiconductor layer 14'. The first doped region may include an impurity diffused from the contact node material 28A. In another embodiment, the first doped region may be formed by a doping process of the impurity.

Figure 19:
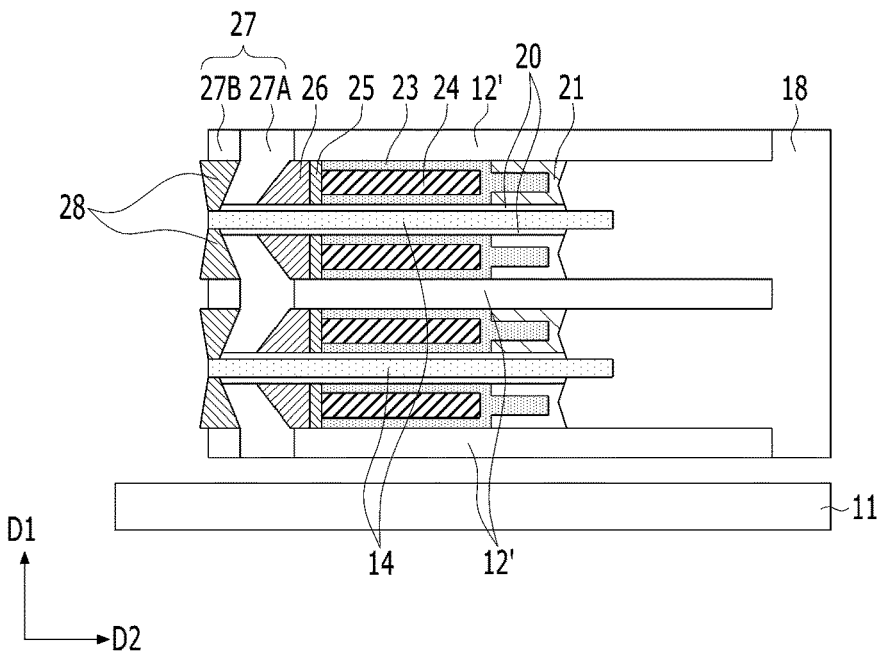

As illustrated in FIG. 19, the contact node material 28A may be etched to form a pair of contact nodes 28.

Figure 20:
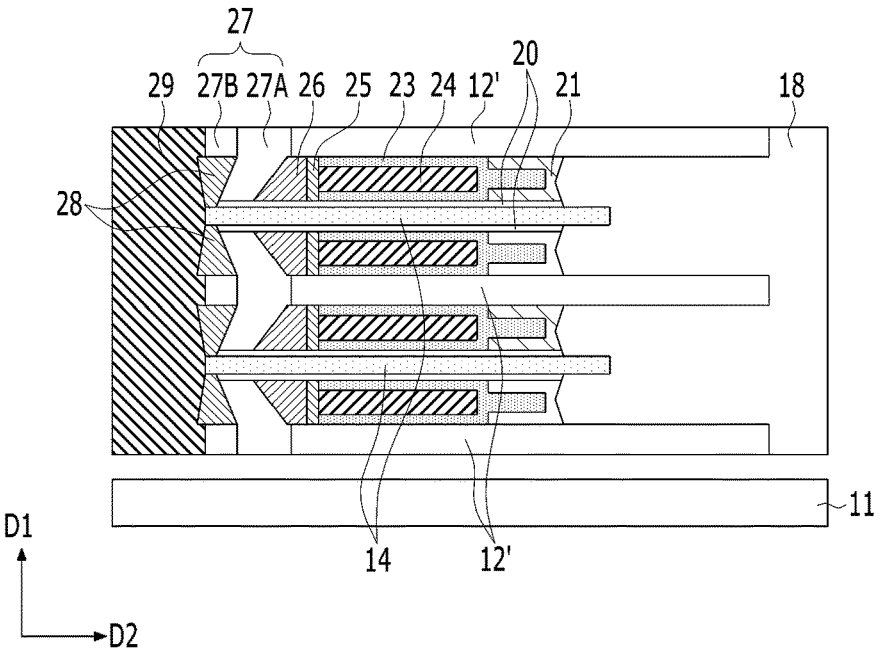

As illustrated in FIG. 20, a vertical conductive line 29 coupled to the contact nodes 28 may be formed. The vertical conductive line 29 may include for example titanium nitride, tungsten, or a combination thereof.

In another embodiment, before the vertical conductive line 29 is formed, a first ohmic contact coupled to one end of the semiconductor layer 14' may be formed. The first ohmic contact may include a metal silicide. For example, a metal layer deposition and an annealing may be sequentially performed to form the metal silicide and remove an unreacted metal layer. Silicon of the semiconductor layer 14' may react with a metal layer to form the metal silicide.

Figure 21:
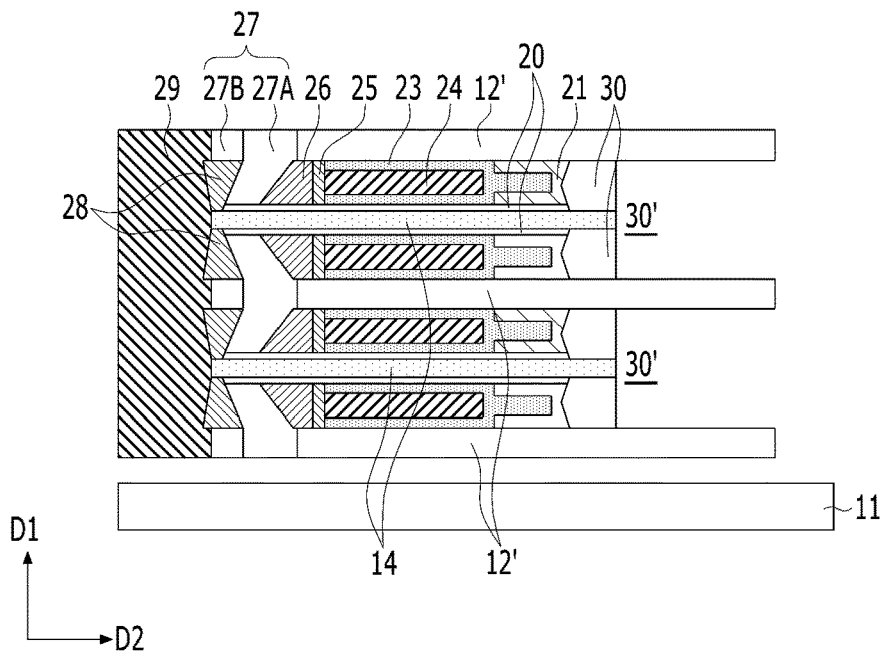

As illustrated in FIG. 21, the sacrificial insulating layer 18 may be selectively recessed. Accordingly, second capping layers 30 may be respectively formed on side surfaces of the first low work function electrodes 21.

After the recess process is performed on the sacrificial insulating layer 18, one side of the semiconductor layer 14' may be cut to form the horizontal layer 14. The horizontal layer 14 may be thinner than the first low work function electrodes 21, the high work function electrodes 24 and the second low work function electrodes 26. The horizontal layer 14 may be referred to as a thin-body active layer.

After the second capping layers 30 and the horizontal layer 14 are formed, a wide opening 30' (for a capacitor opening) may be defined between the insulating layers 12'.

Figure 22:
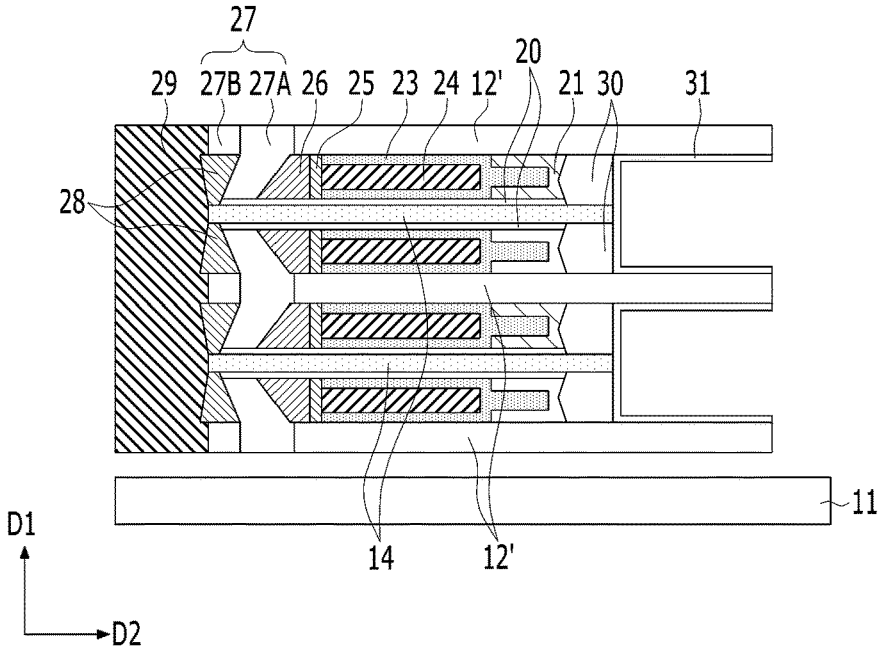

As illustrated in FIG. 22, a first electrode 31 of a data storage element may be formed to contact each of the other ends of the horizontal layers 14. In order to form the first electrode 31, conductive material deposition and etch-back processes may be performed. The first electrode 31 may include titanium nitride. The first electrode 31 may have a horizontally oriented cylindrical shape. The first electrode 31 may be formed in the wide opening 30'.

Figure 23:
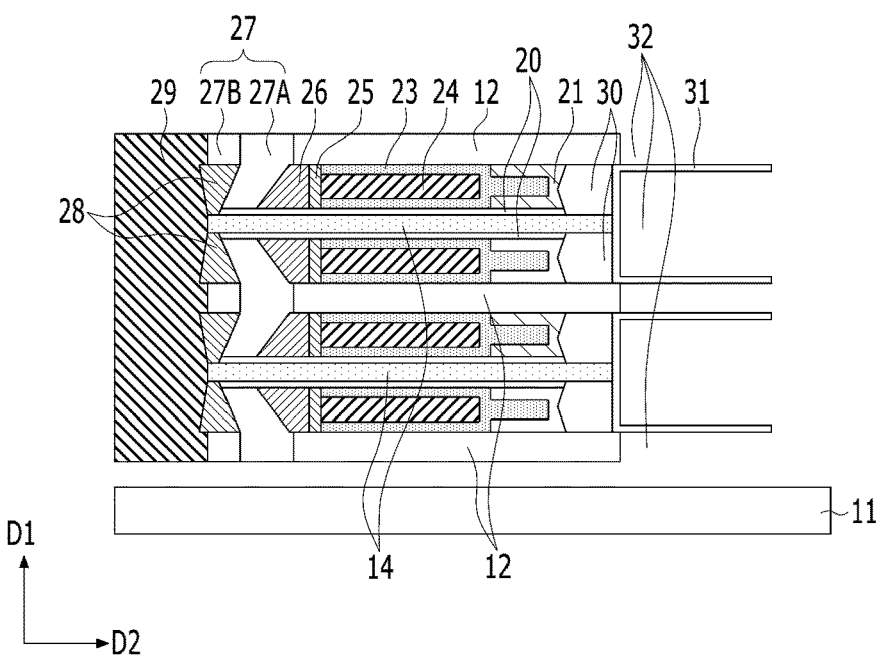

As illustrated in FIG. 23, the insulating layers 12' may be partially recessed 32. Accordingly, outer walls of the first electrodes 31 may be exposed. Remaining insulating layers 12 may contact the horizontal conductive line DWL. The remaining insulating layers 12 may be referred to as cell isolation layers.

Figure 24:
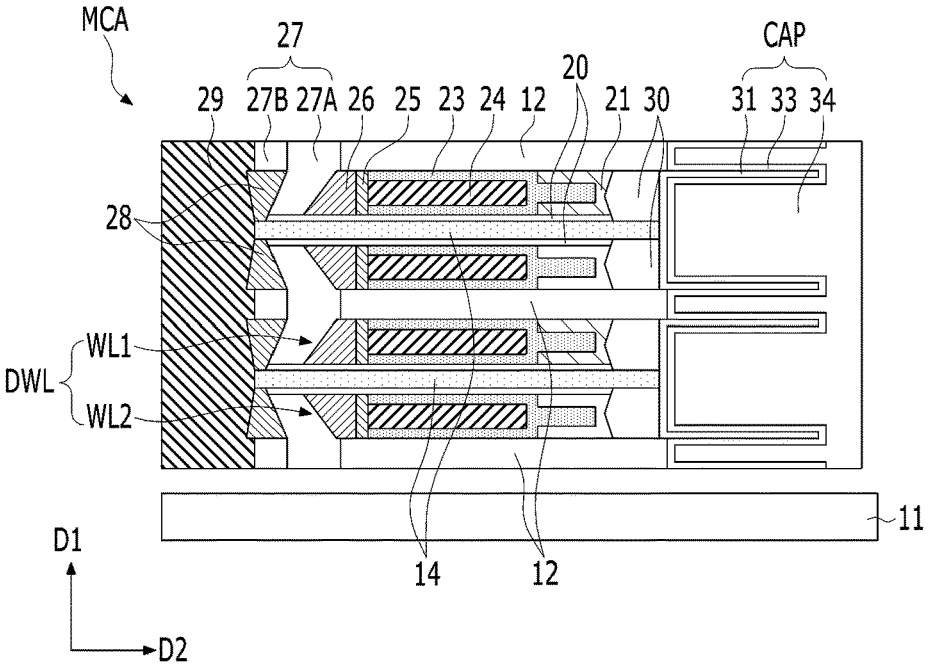

As illustrated in FIG. 24, a dielectric layer 33 and a second electrode 34 may be sequentially formed on each of the first electrodes 31. The first electrode 31, the dielectric layer 33 and the second electrode 34 may become a data storage element CAP.

Figure 25:
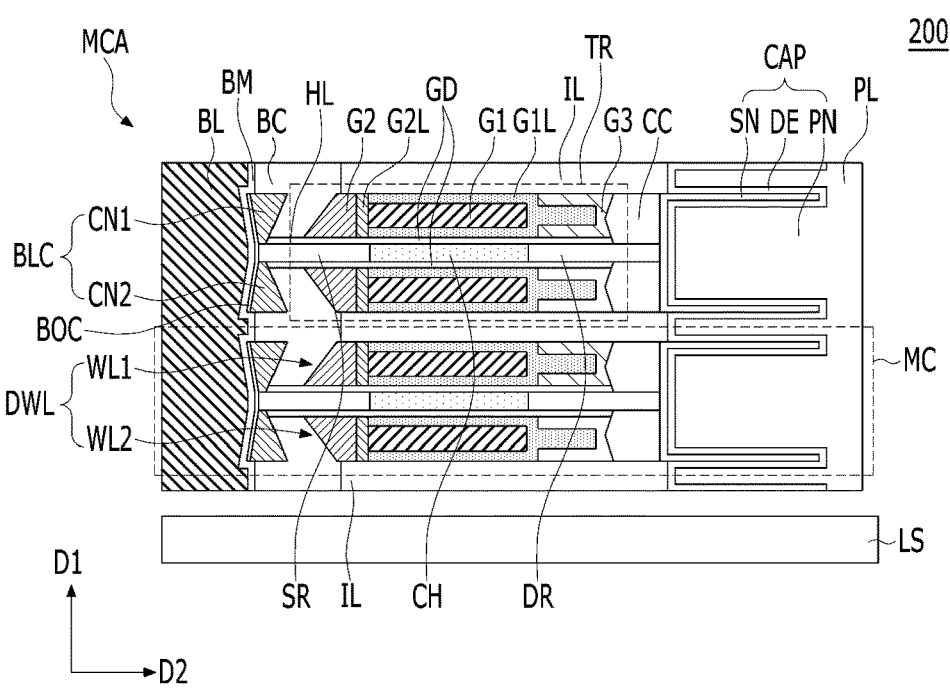
FIGS. 25 and 26 are diagrams illustrating semiconductor devices in accordance with other embodiments.
Figure 26:
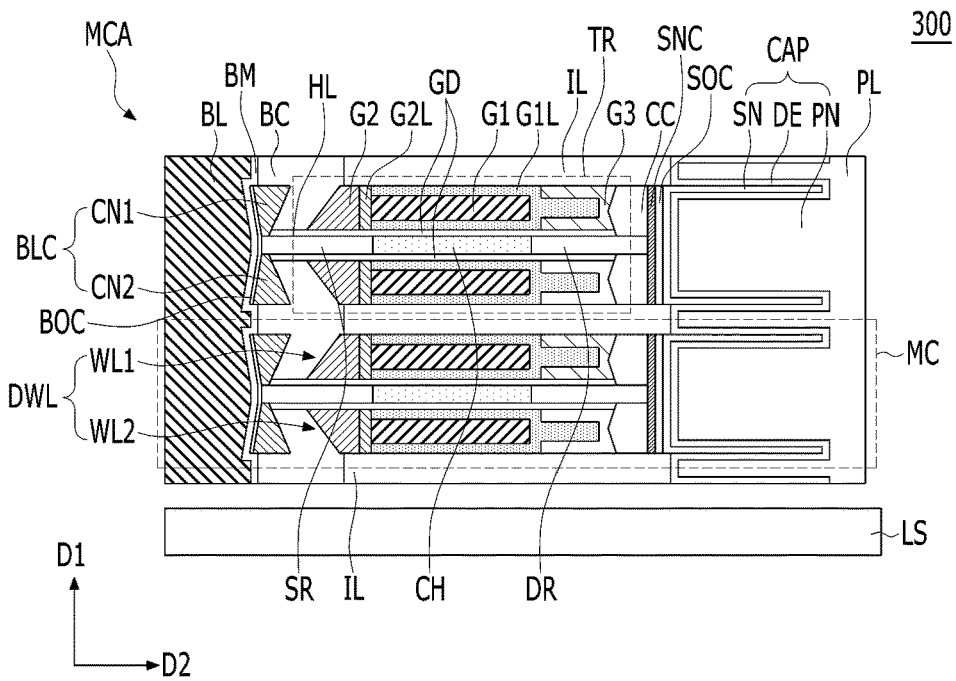

FIGS. 25 and 26 are diagrams illustrating semiconductor devices 200 and 300 in accordance with other embodiments.

Referring to FIGS. 25 and 26, the semiconductor devices 200 and 300 may each include a lower structure LS and a memory cell array MCA. The memory cell array MCA may include a 3D array of memory cells MC. Each of the memory cell MC may include a vertical conductive line BL, a switching element TR, and a data storage element CAP. The data storage element CAP may include a first electrode SN, a dielectric layer DE, and a second electrode PN. The switching element TR may include a horizontal layer HL and a horizontal conductive line DWL. The horizontal layer HL may include a first doped region SR, a channel CH, and a second doped region DR. The horizontal conductive line DWL may include a pair of first work function electrodes G1, a pair of second work function electrodes G2, and a pair of third work function electrodes G3. The second work function electrodes G2 may be adjacent to (or otherwise between the first work function electrode G1 and) the vertical conductive line BL, and the third work function electrodes G3 may be adjacent to (or otherwise between the first work function electrode G1 and) the data storage element CAP. The first work function electrodes G1 may overlap the channel CH.

A contact node BLC may be formed between the first doped region SR and the vertical conductive line BL. The contact node BLC may include a first contact node CN1 disposed on an upper edge of the first doped region SR, and a second contact node CN2 disposed on a lower edge of the first doped region SR. Each of the first and second contact nodes CN1 and CN2 may include N-type dopant doped polysilicon.

A vertical barrier layer BM may be formed between the contact node BLC and the vertical conductive line BL. An ohmic contact BOC may be formed between the contact node BLC and the vertical barrier layer BM. The vertical barrier layer BM may include a metal nitride, and the ohmic contact BOC may include a metal silicide. For example, the vertical barrier layer BM may include titanium nitride, and the ohmic contact BOC may include titanium silicide. Since the first and second contact nodes CN1 and CN2 are disposed on the upper edge and the lower edge of the first doped region SR, respectively, the vertical height of the ohmic contact BOC may increase, thereby making it possible to improve a contact resistance.

Referring back to FIG. 26, the semiconductor device 300 may further include an additional contact node SNC and an additional ohmic contact SOC. The additional contact node SNC may be disposed between the second doped region DR and the first electrode SN, and the additional ohmic contact SOC may be between the additional contact node SNC and the first electrode SN. The additional contact node SNC may be formed of the same material as the contact node BLC. The additional ohmic contact SOC may be formed of the same material as the ohmic contact BOC. The second doped region DR may include an impurity diffused from the additional contact node SNC.

Referring to FIGS. 25 and 26, a first capping layer BC may include a combination of a first capping material and a second capping material, the first capping material may be silicon oxide, and the second capping material may be silicon nitride. The first capping material and the second capping material may correspond to the first capping material 27A and the second capping material 27B of FIG. 17, respectively.

In the above-described embodiments, the horizontal conductive line DWL has been described as having a double structure including the first horizontal conductive line WL1 and the second horizontal conductive line WL2, but in other embodiments, the horizontal conductive line DWL may have a single structure. For example, the horizontal conductive line DWL may be formed of only one of the first horizontal conductive line WL1 and the second horizontal conductive line WL2. The horizontal conductive line DWL having the single structure may also have a triple work function structure. That is, the horizontal conductive line DWL may include the first work function electrode G1, the second work function electrode G2, and the third work function electrode G3, and the second work function electrode G2 may have a sloped side facing the vertical conductive line BL.

According to the embodiments, as a word line having a triple electrode structure is formed, a higher integration of memory cells may be realized.

According to the embodiments, as a word line having a triple electrode structure is formed, leakage current may be reduced, and thus refresh characteristics may be secured, which leads to lower power consumption.

According to the embodiments, the triple electrode structure is relatively advantageous in reducing an increase in an electric field generated when the channel thickness is reduced for high integration, and thus it is also advantageous for higher integration through realization of a higher number of stacked layers in the same volume.

According to the embodiments, since a barrier layer is formed between a high work function electrode and a low work function electrode, electrical characteristics of a word line may be improved.

According to the embodiments, as a sloped work function electrode is formed, parasitic capacitance between a vertical conductive line and a horizontal conductive line may be reduced.

According to the embodiments, a lower power consumption and higher integration of a 3D memory cell may be realized when the triple electrode structure is used.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure and the following claims.

What is claimed is:

1. A semiconductor device comprising:
a lower structure;
a horizontal layer spaced apart from the lower structure and extending along a direction parallel to the lower structure;
a vertical conductive line extending along a direction perpendicular to the lower structure and coupled to a first side end of the horizontal layer;
a data storage element coupled to a second side end of the horizontal layer; and
a horizontal conductive line extending along a direction crossing the horizontal layer wherein the horizontal conductive line includes a sloped side facing the vertical conductive line and upper and lower horizontally-oriented flat surfaces.

2. The semiconductor device of claim 1, wherein the horizontal conductive line includes:
a first work function electrode;
a second work function electrode having the sloped side facing the vertical conductive line and having a lower work function than the first work function electrode; and
a third work function electrode adjacent to the data storage element and having a lower work function than the first work function electrode.

3. The semiconductor device of claim 2, further comprising:
a first barrier layer disposed between the first work function electrode and the third work function electrode; and
a second barrier layer disposed between the first work function electrode and the second work function electrode.

4. The semiconductor device of claim 3, wherein the first barrier layer includes a protrusion a) covering the first work function electrode and b) disposed on an inner side surface of the third work function electrode.

5. The semiconductor device of claim 4, wherein the third work function electrode has a bent shape including an inner side surface covering the protrusion of the first barrier layer.

6. The semiconductor device of claim 2, wherein the second and third work function electrodes each include N-type dopant doped polysilicon.

7. The semiconductor device of claim 2, wherein the first work function electrode includes a metal-based material.

8. The semiconductor device of claim 2, wherein the first work function electrode includes a metal, a metal nitride, or a combination thereof.

9. The semiconductor device of claim 2, wherein the first work function electrode has a larger volume than the second and third work function electrodes.

10. The semiconductor device of claim 2, wherein each of the first, second and third work function electrodes vertically overlaps the horizontal layer.

11. The semiconductor device of claim 2, wherein the first work function electrode and the second work function electrode have the same work function.

12. The semiconductor device of claim 2, wherein the horizontal layer has a smaller thickness than the first, second and third work function electrodes.

13. The semiconductor device of claim 1, wherein the horizontal layer includes a monocrystalline semiconductor material, a polycrystalline semiconductor material, or an oxide semiconductor material.

14. The semiconductor device of claim 1, wherein the horizontal layer includes:
a first doped region coupled to the vertical conductive line;
a second doped region coupled to the data storage element; and
a channel disposed between the first doped region and the second doped region.

15. The semiconductor device of claim 1, wherein the horizontal conductive line includes horizontal conductive lines having a double structure, which face each other with the horizontal layer interposed therebetween.

16. The semiconductor device of claim 1, wherein the data storage element includes a capacitor including a first electrode having a cylindrical shape, a second electrode, and a dielectric layer disposed between the first and second electrodes.

17. The semiconductor device of claim 1, further comprising:

a first contact node disposed on an upper portion of an edge of the horizontal layer;

a second contact node disposed on a lower portion of the edge of the horizontal layer; and an ohmic contact coupled to the edge of the horizontal layer, the first contact node and the second contact node.

18. The semiconductor device of claim 17, wherein the first and second contact nodes each include doped polysilicon.

19. The semiconductor device of claim 17, further comprising a vertical barrier layer disposed between the vertical conductive line and the ohmic contact.

20. The semiconductor device of claim 1, wherein the horizontal conductive line includes:

a high work function electrode;

a first low work function electrode having the sloped side facing the vertical conductive line and having a lower work function than the high work function electrode; and a second low work function electrode having a non-sloped side adjacent to the data storage element and having a lower work function than the high work function electrode.

\* \* \* \* \*